United States Patent
Shibata et al.

(10) Patent No.: US 10,469,167 B2
(45) Date of Patent: Nov. 5, 2019

(54) OPTICAL COMMUNICATION SYSTEM AND OPTICAL COMMUNICATION METHOD

(71) Applicant: NIPPON TELEGRAPH AND TELEPHONE CORPORATION, Tokyo (JP)

(72) Inventors: Naotaka Shibata, Yokosuka (JP); Shigeru Kuwano, Yokosuka (JP); Yutaka Kamamoto, Atsugi (JP); Takehiro Moriya, Atsugi (JP); Jun Terada, Yokosuka (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 15/574,319

(22) PCT Filed: Apr. 7, 2016

(86) PCT No.: PCT/JP2016/061374
§ 371 (c)(1),
(2) Date: Nov. 15, 2017

(87) PCT Pub. No.: WO2016/185823
PCT Pub. Date: Nov. 24, 2016

(65) Prior Publication Data
US 2018/0294881 A1  Oct. 11, 2018

(30) Foreign Application Priority Data
May 19, 2015  (JP) ................................ 2015-101840

(51) Int. Cl.
*H04B 10/00* (2013.01)
*H04B 10/2575* (2013.01)
(Continued)

(52) U.S. Cl.
CPC ....... *H04B 10/25752* (2013.01); *H04L 69/04* (2013.01); *H04B 10/00* (2013.01); *H04B 10/69* (2013.01); *H04L 25/49* (2013.01)

(58) Field of Classification Search
CPC .................. H04B 1/40; H04B 10/2575; H04B 10/25753; H04B 10/25754;
(Continued)

(56) References Cited

U.S. PATENT DOCUMENTS 5,247,638 A * 9/1993 O'Brien ................. G06F 3/0601
341/87
5,939,700 A * 8/1999 Ackley ................... G06K 1/121
235/436
(Continued)

FOREIGN PATENT DOCUMENTS

| CN | 102075467 A | 5/2011 |
|----|-------------|--------|
| CN | 104221308 A | 12/2014 |

(Continued)

OTHER PUBLICATIONS

CPRI, "CPRI Specification V6.0", Aug. 2013, http://www.cpri.info/spec.html.
(Continued)

*Primary Examiner* — Abbas H Alagheband
(74) *Attorney, Agent, or Firm* — Harness, Dickey & Pierce, P.L.C.

(57) ABSTRACT

An optical communication system includes a signal processing apparatus and a wireless apparatus between which functions of a base station are divided, wherein a periodic symbol sequence including a cyclic prefix appended to a signal of a predetermined size to which an IFFT (Inverse Fast Fourier Transform) has been applied is transmitted between the signal processing apparatus and the wireless apparatus by means of digital RoF (Radio over Fiber)
(Continued)

transmission, the signal processing apparatus and the wireless apparatus each include a transmission unit and a reception unit, the transmission unit includes: a compression size determination unit that acquires symbol information relating to a starting position of the symbol sequence and lengths of symbols constituting the symbol sequence, and that determines, based on the acquired symbol information, a compression size for each of symbols that are to be compressed; and a compression unit that compresses the symbol sequence in units of determined compression sizes, and the reception unit includes: an expansion size determination unit that determines an expansion size for each of symbols in the symbol sequence that are to be expanded; and an expansion unit that expands the symbol sequence in units of determined expansion sizes.

4 Claims, 20 Drawing Sheets

(51) Int. Cl.
  *H04L 29/06* (2006.01)
  *H04L 25/49* (2006.01)
  *H04B 10/69* (2013.01)
(58) Field of Classification Search
  CPC ........ H04B 10/25755; H04B 10/25756; H04B 10/25758; H04B 10/25759; H04J 11/00; H04J 14/0278; H04W 88/08
  USPC ......................................... 398/115, 116, 136
  See application file for complete search history.

(56) References Cited

U.S. PATENT DOCUMENTS

| | | | | |
|---|---|---|---|---|
| 8,005,152 | B2* | 8/2011 | Wegener | H03M 7/40 375/241 |
| 8,260,143 | B2* | 9/2012 | Gupta | H04L 27/2096 398/115 |
| 8,260,144 | B2* | 9/2012 | Gupta | H04L 27/2096 398/115 |
| 8,902,090 | B2* | 12/2014 | Cheng | H03M 7/30 341/87 |
| 9,020,362 | B2* | 4/2015 | Gupta | H04L 27/2096 398/193 |
| 2002/0033762 | A1* | 3/2002 | Belu | H03M 7/30 341/87 |
| 2009/0232507 | A1* | 9/2009 | Gupta | H04L 27/2096 398/115 |
| 2009/0232510 | A1* | 9/2009 | Gupta | H04L 27/2096 398/136 |
| 2011/0135013 | A1* | 6/2011 | Wegener | H03M 7/40 375/241 |
| 2012/0250740 | A1* | 10/2012 | Ling | H04W 88/085 375/219 |
| 2012/0328301 | A1* | 12/2012 | Gupta | H04L 27/2096 398/116 |
| 2013/0321181 | A1* | 12/2013 | Cheng | H03M 7/30 341/87 |
| 2015/0229397 | A1* | 8/2015 | Shibata | H04B 10/25754 398/115 |

FOREIGN PATENT DOCUMENTS

| | | | |
|---|---|---|---|
| JP | 2011-526095 | A | 9/2011 |
| JP | 2013-251895 | A | 12/2013 |
| JP | 2014-090240 | A | 5/2014 |
| JP | 2014-099679 | A | 5/2014 |
| JP | 2015-056736 | A | 3/2015 |
| WO | WO-2009/151893 | A2 | 12/2009 |

OTHER PUBLICATIONS

Yutaka Kamamoto, Takehiro Moriya, Noboru Harada, Csaba Kos, "Enhancement of MPEG-4 ALS Lossless Audio Coding", NTT Technical Journal, Feb. 2008, with full translation.
Erik Dahlman et al. (authors), Takeshi Hattori et al. (translation supervision),"3G Evolution Second edition HSPA and LTE for Mobile Broadband", Dec. 2009,pp. 356, 425, with partial translation.
Yasuo Suzuki et al., "Data Compression of Digitized Radio-on-Fiber (DRoF) System for Wide-Area Ubiquitous Network", Proceedings of the 2006 IEICE Communications Society Conference 1, Sep. 7, 2006 (Sep. 7, 2006), p. 472.
Naotaka Shibata et al., "Data Compression Technique using Wireless Resource Allocation for Mobile Fronthaul with TDM-PON", IEICE Technical Report, Jan. 16, 2014 (Jan. 16, 2014), vol. 113, No. 390, pp. 51 to 56, including abstract.
International Search Report for PCT/JP2016/061374, ISA/JP, Tokyo, dated Jun. 14, 2016, with English translation attached.
Anonymous: "Data compression ratio", Wikipedia, Apr. 30, 2015 [retrieved on Nov. 22, 2018].
Telesystem Innovations: "LTE in a Nutshell: The Physical Layer White Paper", Jan. 1, 2010, pp. 1-18 [retrieved on Jul. 22, 2016].
Extended European Search report for related application EP 16796217. 4, ISA/EP, Munich, dated Dec. 7, 2018.
Chinese Office Action regarding CNSN 2016800284532, dated Jun. 3, 2019.

* cited by examiner

FIG. 20

| | FRAME NUMBER | COMPRESSION RATE |
|---|---|---|
| (a) | 1 | 0.690693 |
| (a) | 2 | 0.691606 |
| (a) | 3 | 0.677007 |
| (a) | 4 | 0.686131 |
| (b) | 5 | 0.79927 |
| (c) | 6 | 0.687044 |
| (c) | 7 | 0.691606 |
| (c) | 8 | 0.688869 |
| (d) | 9 | 0.763686 |
| (e) | 10 | 0.687956 |
| (e) | 11 | 0.691606 |
| (e) | 12 | 0.694343 |
| (f) | 13 | 0.818431 |
| (g) | 14 | 0.687956 |
| (g) | 15 | 0.679745 |
| (g) | 16 | 0.683394 |
| (h) | 17 | 0.779197 |
| (i) | 18 | 0.686131 |
| (i) | 19 | 0.685219 |
| (i) | 20 | 0.685219 |
| (j) | 21 | 0.781022 |
| | 22 | 0.69708 |

OPTICAL COMMUNICATION SYSTEM AND OPTICAL COMMUNICATION METHOD

CROSS-REFERENCE TO RELATED APPLICATIONS

This application is a 371 U.S. National Stage of International Application No. PCT/JP2016/061374, filed Apr. 7, 2016, which claims the benefit of and priority to Japanese Patent Application No. 2015-101840, filed May 19, 2015. The disclosures of the above applications are incorporated herein by reference.

TECHNICAL FIELD

The present invention relates to digital RoF (Radio over Fiber) transmission technology.

BACKGROUND ART

Conventionally, in order to improve the level of freedom of cell architecture in cellular systems, configurations in which the functions of a base station apparatus are divided between a signal processing unit (hereinafter referred to as "BBU" (BaseBand Unit)) and an RF unit (hereinafter referred to as "RRH" (Remote Radio Head)), and the BBU and the RRH are physically separated, have been considered. In such a configuration, the wireless signals transmitted between the BBU and the RRH are transmitted by means of RoF technology. RoF technologies can be largely divided between analog RoF technologies and digital RoF technologies, depending on the optical transmission method. In recent years, the study of digital RoF technologies having superior transmission quality has flourished, and standardization organizations such as the CPRI (Common Public Radio Interface) and the like are working towards the establishment of specifications (see, e.g., Non-patent Document 1). Additionally, while coaxial cable, optical fiber, and the like can be used as the connecting media between BBUs and RRHs, the transmission distance can be extended, in particular, by using optical fiber to connect BBUs and RRHs.

Herebelow, digital RoF transmission will be explained.

In discussing digital RoF transmission, the following terminology will be defined.

A downlink refers to the communication path of radio waves transmitted from a BBU, via an RRH, to a wireless terminal connected to the RRH.

An uplink refers to the communication path of radio waves transmitted from a wireless terminal connected to an RRH, via the RRH, to a BBU.

On a digital RoF transmission downlink, the following processes are performed. A BBU prepares a digital signal (hereinafter referred to as "IQ data") separately for the I-axis and Q-axis components of a wireless signal, converts the prepared IQ data into an optical signal, and transmits the converted optical signal to an RRH via an optical fiber. The RRH converts the received optical signal into a wireless signal, and transmits the converted wireless signal to a wireless terminal.

Additionally, on a digital RoF transmission uplink, the following processes are performed. An RRH receives a wireless signal transmitted from a wireless terminal, converts the received wireless signal into an optical signal, and transmits the converted optical signal to a BBU via an optical fiber. The BBU converts the received optical signal into IQ data and demodulates the signal.

FIG. 15 is a schematic block diagram illustrating the functional structure of an RRH 500 during digital RoF transmission.

The RRH 500 includes an antenna 501, a transmission/reception switching unit 502, an amplifier 503, a down-conversion unit 504, an A/D (Analog/Digital) conversion unit 505, a baseband filter unit 506, a framing unit 507, an E/O (Electric/Optic) conversion unit 508, an O/E (Optic/Electric) conversion unit 509, a deframing unit 510, a baseband filter unit 511, a D/A (Digital/Analog) conversion unit 512, an up-conversion unit 513, and an amplifier 514.

The antenna 501 transmits and receives wireless signals. The transmission/reception switching unit 502 switches the antenna 501 between transmission and reception. The amplifier 503 amplifies the signal power of a received wireless signal to a level that allows for signal processing. The down-conversion unit 504 down-converts the amplified wireless signal into the baseband. The A/D conversion unit 505 converts the down-converted wireless signal (analog signal) into IQ data, which is a digital signal. The baseband filter unit 506 performs a filtering process on the IQ data. The framing unit 507 performs framing by multiplexing the filtered IQ data with a control signal. The E/O conversion unit 508 converts the framed signal (hereinafter referred to as the "frame signal") (electrical signal) into an optical signal, and transmits the converted optical signal to the BBU via an optical fiber 550.

The O/E conversion unit 509 converts an optical signal received via the optical fiber 550 into a frame signal (electrical signal). The deframing unit 510 extracts a control signal and IQ data from the frame signal. The baseband filter unit 511 performs a filtering process on the IQ data. The D/A conversion unit 512 converts the filtered IQ data into an analog signal. The up-conversion unit 513 up-converts the analog signal. The amplifier 514 amplifies the power of the analog signal to a predetermined transmission power.

FIG. 16 is a schematic block diagram illustrating the functional structure of a BBU 600 during digital RoF transmission.

The BBU 600 includes an O/E conversion unit 601, a deframing unit 602, a modulation/demodulation unit 603, a framing unit 604, and an E/O conversion unit 605.

The O/E conversion unit 601 converts an optical signal received via an optical fiber 650 into a frame signal (electrical signal). The deframing unit 602 extracts a control signal and IQ data from the frame signal. The modulation/demodulation unit 603 restores a wireless signal by demodulating the IQ data. Additionally, the modulation/demodulation unit 603 generates IQ data by modulating the wireless signal. The framing unit 604 performs framing by multiplexing the IQ data with a control signal. The E/O conversion unit 605 converts the frame signal (electrical signal) into an optical signal and transmits the converted optical signal to the RRH 500 via the optical fiber 650.

Digital RoF transmission requires an extremely broad band in the optical fiber section. For example, in an LTE (Long Term Evolution) system, the wireless signals in a 2×2 MIMO (Multiple-Input and Multiple-Output) with a system bandwidth of 20 MHz have a maximum data rate of 150 Mbps in the wireless section. However, in order to transmit these wireless signals at a 15-bit quantization bit rate, a CPRI link of option 3 (2.4576 Gbps) or greater is needed. Therefore, the application of compression technologies to digital RoF transmission is being studied in order to make effective use of the optical band. Compression techniques can be largely divided between lossy compression and lossless compression. Lossy compression includes reduction of the sampling frequency, reduction of the quantization bit rate, or the like. Lossless compression includes a combination of linear predictive coding and entropy coding or the like. For example, when raising the transmission rate in the wireless section, the required transmission band in the optical section will also increase, but the increased speed in the wireless section can be handled without changing the optical transceiver if the required transmission band in the optical section is reduced by compression technology. For example, Non-patent Document 2 discusses MPEG-4 ALS (Moving Picture Experts Group-4 Audio Lossless Coding), which is a lossless compression technique.

FIG. 17 is a schematic block diagram illustrating the functional structure of an RRH 500a when incorporating compression technology during multiplexed transmission.

The RRH 500a includes an antenna 501, a transmission/reception switching unit 502, an amplifier 503, a down-conversion unit 504, an A/D conversion unit 505, a baseband filter unit 506, a compression unit 701, a framing unit 507a, an E/O conversion unit 508, an O/E conversion unit 509, a deframing unit 510, an expansion unit 702, a baseband filter unit 511a, a D/A conversion unit 512, an up-conversion unit 513, and an amplifier 514.

The compression unit 701 compresses filtered IQ data. The framing unit 507a performs framing by multiplexing the compressed IQ data with a control signal. The expansion unit 702 restores the IQ data by decompressing the compressed IQ data. The baseband filter unit 511a performs a filtering process on the restored IQ data.

FIG. 18 is a schematic block diagram illustrating the functional structure of a BBU 600a when incorporating compression technology during multiplexed transmission.

The BBU 600a includes an O/E conversion unit 601, a deframing unit 602, an expansion unit 801, a modulation/demodulation unit 603a, a compression unit 802, a framing unit 604a, and an E/O conversion unit 605.

The expansion unit 801 restores IQ data by decompressing compressed IQ data. The modulation/demodulation unit 603a restores a wireless signal by demodulating the restored IQ data. Additionally, the modulation/demodulation unit 603a generates IQ data by modulating the wireless signal. The compression unit 802 compresses the IQ data. The framing unit 604a performs framing by multiplexing the compressed IQ data with a control signal.

Among compression technologies, there are those in which a compression process and an expansion process are performed for every predetermined number of samples. In the following explanation, the units for performing the compression process will be referred to as frames, and the predetermined number of samples will be referred to as the frame size. For example, in compression technologies using linear predictive coding, a predicted value is obtained by multiplying coefficients by a number of sample points that are older than a given sample point and adding the multiplication results, and the error between the predicted value and the given sample point is outputted. If the prediction accuracy is high, then the amplitude value of the error signal will be close to zero. For this reason, the required band in the optical section can be reduced by entropy coding for transmitting data at a lower bit rate for amplitude values that have a higher probability of occurrence. It is to be noted that the coefficients are determined separately for each frame, and calculated so that the prediction error will be small for the IQ data in each frame.

Next, LTE wireless signals will be explained.

In LTE, OFDM (Orthogonal Frequency Division Multiplexing) is used in the downlink. As the time waveform, a signal having a cyclic prefix appended to a signal of a predetermined size that has been subjected to an IFFT (Inverse Fast Fourier Transform) is periodically outputted. On the other hand, in LTE, DFT-S-OFDM (Discrete Fourier Transform-Spread-OFDM) is used in the uplink. In this case also, as with OFDM, a signal having a cyclic prefix appended to a signal of a predetermined size that has been subjected to an IFFT is periodically outputted as the time waveform. In the following explanation, a signal having a cyclic prefix appended to a signal that has been subjected to an IFFT will be referred to as an OFDM symbol, without making a distinction between the downlink and the uplink.

In LTE, a normal cyclic prefix and an extended cyclic prefix are defined. A normal cyclic prefix is shorter than an extended cyclic prefix, and has higher frequency utilization efficiency. For this reason, normal cyclic prefixes are normally used, and in the following description, normal cyclic prefixes will be explained as an example. FIG. 19 illustrates the structure of time slots in LTE. In the example shown in FIG. 19, seven OFDM symbols are arranged in a 0.5 ms interval. If the system bandwidth is 20 MHz, then the IFFT size is 2048, the size of the cyclic prefix (CP1) of the first OFDM symbol is 160 points and the size of the cyclic prefix (CP2) of the second to seventh OFDM symbols is 144 points. Therefore, the OFDM symbol length is 2208 points for the first OFDM symbol and 2192 points for the second to seventh OFDM symbols. Thus, the OFDM symbol lengths are not all the same. Non-patent Document 3 describes the structure of LTE frames.

FIG. 20 is a diagram illustrating the compression rate for each frame when applying MPEG4-ALS to the data in the I component of a wireless signal.

In FIG. 20, the frame number represents the order in which the frames were compressed. The compression rate is the ratio of the data amount after compression to the original data amount. The wireless signal was OFDM-modulated using 1200 subcarriers with a subcarrier spacing of 15 kHz, modulated by 256 QAM (Quadrature Amplitude Modulation), with cyclic prefixes that were 160 samples (first OFDM symbol) or 144 samples (second to seventh OFDM symbols) long. In other words, it was assumed that the entire wireless band was used for data transmission in an LTE downlink system with a system bandwidth of 20 MHz. The frame size was 548.

In FIG. 20, (a) indicates the compression rate when only the first OFDM symbol is contained in a frame. (b) indicates the compression rate when the first OFDM symbol and the second OFDM symbol are contained in a frame. (c) indicates the compression rate when only the second OFDM symbol is contained in a frame. (d) indicates the compression rate when the second OFDM symbol and the third OFDM symbol are contained in a frame. (e) indicates the compression rate when only the third OFDM symbol is contained in a frame. (f) indicates the compression rate when the third OFDM symbol and the fourth OFDM symbol are contained in a frame. (g) indicates the compression rate when only the fourth OFDM symbol is contained in a frame. (h) indicates the compression rate when the fourth OFDM symbol and the fifth OFDM symbol are contained in a frame. (i) indicates the compression rate when only the fifth OFDM symbol is contained in a frame. (j) indicates the compression rate when the fifth OFDM symbol and the sixth OFDM symbol are contained in a frame.

PRIOR ART DOCUMENTS

Non-Patent Documents

Non-patent Document 1: CPRI, "CPRI Specification V6.0", August 2013, http://www.cpri.info/spec.html Non-patent Document 2: Yutaka Kamamoto, Takehiro Moriya, Noboru Harada, Csaba Kos, "Enhancement of MPEG-4 ALS Lossless Audio Coding", NTT Technical Journal, February 2008

Non-patent Document 3: Erik Dahlman et al. (authors), Takeshi Hattori et al. (translation supervision), "3G Evolution Second edition HSPA and LTE for Mobile Broadband", December 2009, pp. 356, 425

SUMMARY OF INVENTION

Problems to be Solved by Invention

As shown in FIG. 20, the compression rate when a compression process is performed without including multiple kinds of OFDM symbols is less than 0.7, while the compression rate when a compression process is performed while including multiple kinds of OFDM symbols always exceeds 0.7. In other words, when performing a compression process while including multiple kinds of OFDM symbols, the compression rate becomes worse than for the case in which the compression process is performed within only one OFDM symbol. This is believed to be due to the fact that the prediction accuracy becomes lower because the frequency components are different and the signal properties differ between OFDM symbols. Thus, with conventional technologies, there is a problem in that the compression rate becomes worse due to compression processes being performed while including multiple kinds of OFDM symbols.

In view of the above-described circumstances, an object of the present invention is to provide a technology that can reduce the worsening of the compression rate.

Means for Solving the Problems

An aspect of the present invention is an optical communication system including: a signal processing apparatus; and a wireless apparatus, in which functions of a base station are divided between the signal processing apparatus and the wireless apparatus, a periodic symbol sequence including a cyclic prefix appended to a signal of a predetermined size to which an IFFT (Inverse Fast Fourier Transform) has been applied is transmitted between the signal processing apparatus and the wireless apparatus by means of digital RoF (Radio over Fiber) transmission, the signal processing apparatus and the wireless apparatus each include a transmission unit and a reception unit; the transmission unit includes: a compression size determination unit that acquires symbol information relating to a starting position of the symbol sequence and lengths of symbols constituting the symbol sequence and determines, based on the acquired symbol information, a compression size for each of symbols that are to be compressed; and a compression unit that compresses the symbol sequence in units of determined compression sizes, and the reception unit includes: an expansion size determination unit that determines an expansion size for each of symbols in the symbol sequence that are to be expanded; and an expansion unit that expands the symbol sequence in units of determined expansion sizes.

In the above-mentioned optical communication system, the transmission unit may further include a compression rate measurement unit that measures a compression rate of each of the symbols, and the compression size determination unit may acquire, as the starting position, a position of a symbol at which a predetermined statistical value of measured compression rates is smallest, and determine the compression sizes using the acquired starting position and information relating to the lengths of the symbols.

In the above-mentioned optical communication system, the transmission unit may further include a symbol information estimation unit that estimates the starting position based on IQ data for a downlink or for an uplink.

An aspect of the present invention is an optical communication method in an optical communication system including a signal processing apparatus and a wireless apparatus between which functions of a base station are divided, the signal processing apparatus and the wireless apparatus each including a transmission unit and a reception unit, a periodic symbol sequence including a cyclic prefix appended to a signal of a predetermined size to which an IFFT (Inverse Fast Fourier Transform) has been applied being transmitted between the signal processing apparatus and the wireless apparatus by means of digital RoF (Radio over Fiber) transmission; the optical communication method including: a compression size determination step, performed by the transmission unit, of acquiring symbol information relating to a starting position of the symbol sequence and lengths of symbols constituting the symbol sequence, and determining, based on the acquired symbol information, a compression size for each of symbols that are to be compressed; a compression step, performed by the transmission unit, of compressing the symbol sequence in units of determined compression sizes; an expansion size determination step, performed by the reception unit, of determining an expansion size for each of symbols in the symbol sequence that are to be expanded; and an expansion step, performed by the reception unit, of expanding the symbol sequence in units of determined expansion sizes.

Advantageous Effects of Invention

Due to the present invention, it is possible to reduce the worsening of the compression rate.

BRIEF DESCRIPTION OF DRAWINGS

FIG. 20 is a diagram showing the compression rate for each frame when applying MPEG-4 ALS to the I component data in a wireless signal.

MODES FOR CARRYING OUT THE INVENTION

Herebelow, embodiments of the present invention will be explained with reference to the drawings.

[Summary]

According to the present invention, in an optical communication system including an RRH (wireless apparatus) and a BBU (signal processing apparatus) between which the functions of a base station are divided, the RRH and the BBU acquire information (hereinafter referred to as "OFDM symbol information") regarding the starting position of a symbol sequence composed of multiple OFDM symbols (symbols), and the length of each OFDM symbol. Additionally, the RRH and the BBU determine a frame size for each OFDM symbol that is to be compressed based on the acquired OFDM symbol information, and perform compression using the determined frame sizes.

Herebelow, a detailed explanation will be given, using multiple embodiments (first embodiment to third embodiment) as examples.

[First Embodiment]

In the first embodiment, the RRH and the BBU acquire OFDM symbol information (symbol information), determine the frame size for each OFDM symbol that is to be compressed based on the acquired OFDM symbol information, and perform compression using the determined frame sizes. Additionally, the RRH and the BBU determine the frame size of each OFDM symbol that is to be expanded based on the acquired OFDM symbol information, and perform expansion using the determined frame sizes.

Figure 1:
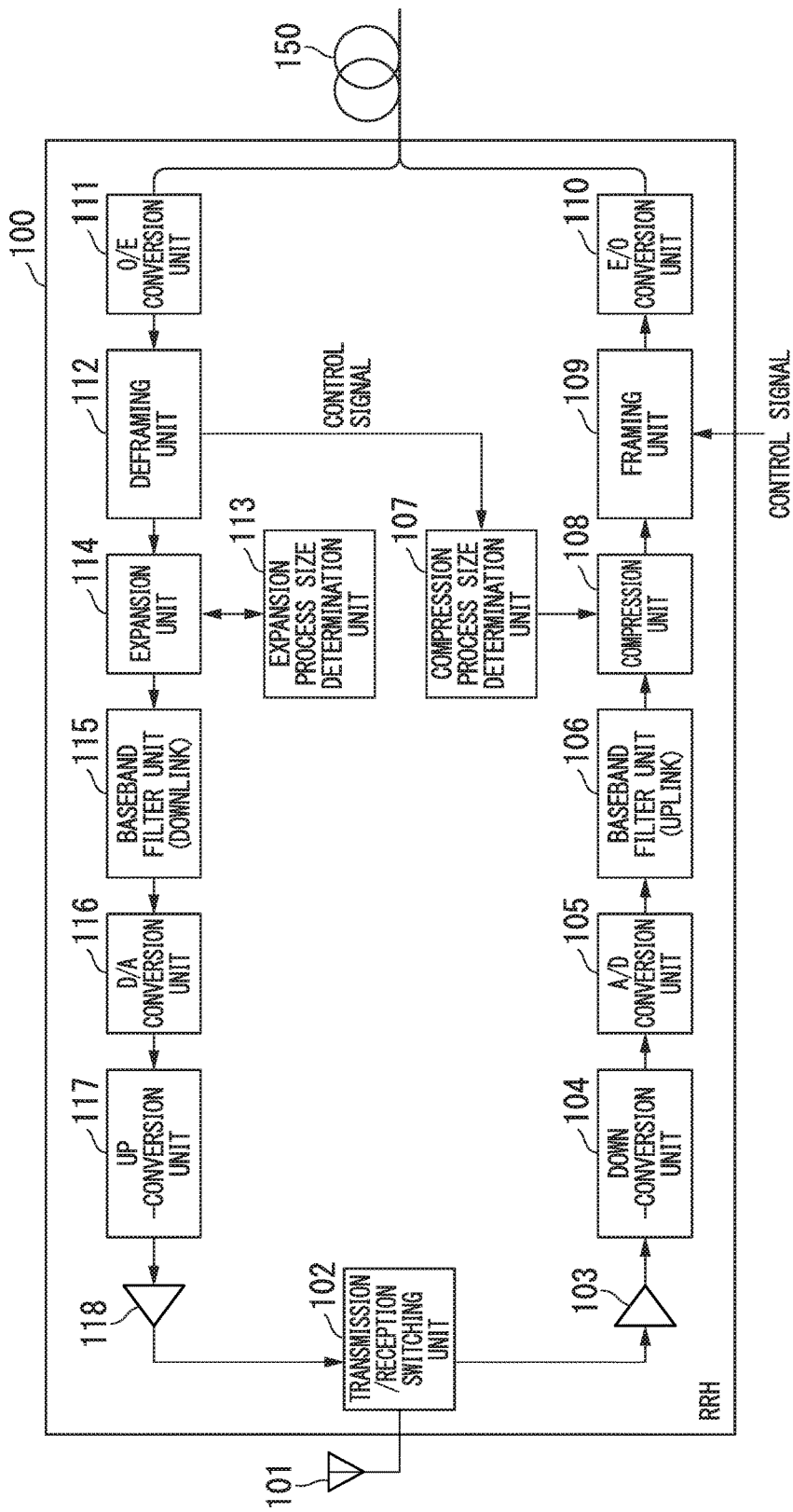
FIG. 1 is a schematic block diagram illustrating the functional structure of an RRH 100 in a first embodiment.
Figure 2:
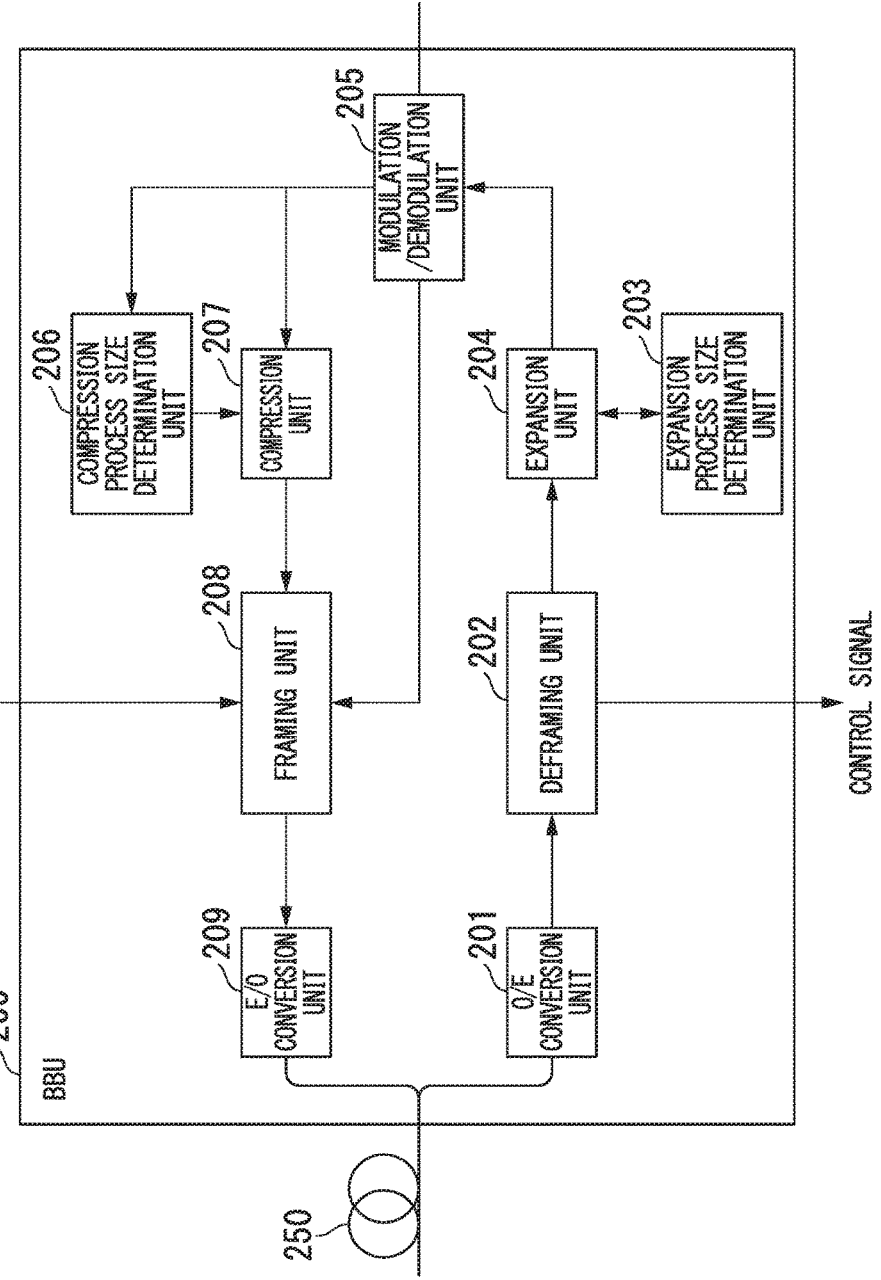
FIG. 2 is a schematic block diagram illustrating the functional structure of a BBU 200 in the first embodiment.

FIG. 1 is a schematic block diagram illustrating the functional structure of the RRH 100 in the first embodiment. Additionally, FIG. 2 is a schematic diagram illustrating the functional structure of the BBU 200 in the first embodiment. First, the RRH 100 will be explained.

The RRH 100 includes an antenna 101, a transmission/reception switching unit 102, an amplifier 103, a down-conversion unit 104, an A/D conversion unit 105, a baseband filter unit 106, a compression process size determination unit 107, a compression unit 108, a framing unit 109, an E/O conversion unit 110, an O/E conversion unit 111, a deframing unit 112, an expansion process size determination unit 113, an expansion unit 114, a baseband filter unit 115, a D/A conversion unit 116, an up-conversion unit 117, and an amplifier 118.

The antenna 101 transmits and receives wireless signals with respect to a wireless terminal connected to the RRH 100. The transmission/reception switching unit 102 switches the antenna 101 between transmission and reception. It is to be noted that the transmission/reception switching unit 102 is compatible with both FDD (Frequency Division Duplex) and TDD (Time Division Duplex). For example, when the BBU and RRH are connected by a CPRI interface, around $1/16$ of the total capacity is used for control signals while $15/16$ is used for sending IQ data, and as a control signal, a K28.5 code or the like is transmitted in order to establish a CPRI link.

The amplifier 103 amplifies the signal power of a received wireless signal to a level that allows for signal processing. The down-conversion unit 104 down-converts the wireless signal into the baseband. The A/D conversion unit 105 converts the down-converted wireless signal (analog signal) into IQ data, which is a digital signal. The baseband filter unit 106 performs a filtering process on the IQ data. Due to this process, OFDM symbols of the wireless signal are generated.

The compression process size determination unit 107 determines the frame sizes (hereinafter referred to as "compression sizes") of frames that are to be compressed, based on the acquired OFDM symbol information. In this case, a frame is a unit by which the compression process is performed, and is formed, for example, by arranging the IQ data in a time waveform for a predetermined number of samples.

The compression unit 108 compresses the OFDM symbols, frame by frame, in units of the compression sizes determined by the compression process size determination unit 107.

The framing unit 109 generates a frame signal by multiplexing the compressed OFDM symbols with a control signal.

The E/O conversion unit 110 converts the frame signal (electrical signal) into an optical signal and transmits the converted optical signal to the BBU 200 via an optical fiber 150.

The O/E conversion unit 111 converts an optical signal received via the optical fiber 150 into a frame signal (electrical signal).

The deframing unit 112 extracts a control signal and compressed OFDM symbols from a frame signal.

The expansion process size determination unit 113 determines frame sizes for performing the expansion process (hereinafter referred to as "expansion sizes") based on frame sizes acquired from the BBU 200. As a method for the expansion process size determination unit 113 to obtain information on the expansion size, it is possible to contemplate a method wherein a compression unit in the BBU 200 is configured to append a frame size, as a header, in front of compressed data and transmit the header and the compressed data, and the frame size is acquired on the basis of the header. In the case of an LTE system, at minimum, two frame sizes may be sufficient, in which case a single bit may be used as the header. The expansion size and the compression size are the same size.

The expansion unit 114 expands the compressed OFDM symbols in units of the expansion sizes determined by the expansion process size determination unit 113. Specifically, the expansion unit 114 restores the OFDM symbols by decompressing the compressed OFDM symbols in units of the determined expansion sizes.

The baseband filter unit 115 performs a filtering process on the restored OFDM symbols.

The D/A conversion unit 116 converts the filtered signal into an analog signal.

The up-conversion unit 117 up-converts the analog signal.

The amplifier 118 amplifies the power of the analog signal to a predetermined transmission power.

Next, the BBU 200 will be explained.

The BBU 200 includes an O/E conversion unit 201, a deframing unit 202, an expansion process size determination unit 203, an expansion unit 204, a modulation/demodulation unit 205, a compression process size determination unit 206, a compression unit 207, a framing unit 208, and an E/O conversion unit 209.

The O/E conversion unit 201 converts an optical signal received via an optical fiber 250 into a frame signal (electrical signal). The deframing unit 202 extracts a control signal and a multiplexed signal from the frame signal.

The expansion process size determination unit 203 determines expansion sizes based on the frame sizes acquired from the RRH 100. As the method for the expansion process size determination unit 203 to acquire the expansion sizes, it is possible to contemplate a method of acquisition by a process similar to that of the expansion process size determination unit 113.

The expansion unit 204 expands compressed OFDM symbols in units of the expansion sizes determined by the expansion process size determination unit 203. Specifically, the expansion unit 204 restores the OFDM symbols by decompressing the compressed OFDM symbols in units of the determined expansion sizes.

The modulation/demodulation unit 205 restores the wireless signal by demodulating the restored OFDM symbols. Additionally, the modulation/demodulation unit 205 outputs the IQ data of the wireless signal to the compression process size determination unit 206 and the compression unit 207.

The compression process size determination unit 206 determines compression sizes based on acquired OFDM symbol information. The relationship between OFDM symbol length and frame size may be predetermined. In that case, the compression process size determination unit 206 determines the compression sizes based on the OFDM symbol lengths in the acquired OFDM symbol information and the predetermined frame sizes. For example, the compression process size determination unit 206 may set frame sizes corresponding to OFDM symbol lengths as the compression sizes.

The compression unit 207 compresses OFDM symbols, frame by frame, in units of the compression sizes determined by the compression process size determination unit 206.

The framing unit 208 generates a frame signal by multiplexing the compressed OFDM symbols with a control signal.

The E/O conversion unit 209 converts the frame signal (electrical signal) into an optical signal and transmits the converted optical signal to the RRH 100 via the optical fiber 250.

It is to be noted that in the following explanation, the compression unit 108 and the compression unit 207 will be referred to simply as compression units when no particular distinction is to be made therebetween. Additionally, in the following explanation, the expansion unit 114 and the expansion unit 204 will be referred to simply as expansion units when no particular distinction is to be made therebetween. Additionally, in the following explanation, the compression process size determination unit 107 and the compression process size determination unit 206 will be referred to simply as compression process size determination units when no particular distinction is to be made therebetween. Additionally, in the following explanation, the expansion process size determination unit 113 and the expansion process size determination unit 203 will be referred to simply as expansion process size determination units when no particular distinction is to be made therebetween.

The compression units perform compression processes in accordance with the determined compression sizes. Additionally, the expansion units perform expansion processes in accordance with the determined expansion sizes. For example, if linear predictive coding is performed by the compression units, the number of samples used for determining coefficients is changed if the frame size (compression size) is changed. The compression units and expansion units may be configured to include compression and expansion circuits for each frame size, and switch between which circuit is to be used in accordance with notified frame sizes.

As the method for the compression process size determination unit 206 to acquire the OFDM symbol information, it could be acquired from the modulation/demodulation unit 205 of the BBU 200. In that case, the compression process size determination unit 107 of the RRH 100 must be notified of the OFDM symbol information. Therefore, if the BBU 200 and RRH 100 are connected by a CPRI interface, then the OFDM symbol information can be transmitted by using reserved bits or the like in the CPRI control signal. The compression process size determination unit 107 acquires the OFDM symbol information from the BBU 200 by being notified of the OFDM symbol information.

For example, in the case of a TDD LTE system, uplink and downlink communications are switched at a minimum period of 1 ms. Therefore, if the OFDM symbol starting position and the OFDM symbol length information in a downlink 0.5 ms period are known, then it is possible to estimate the OFDM symbol starting position and OFDM symbol length information for the uplink. Normally, the OFDM symbol lengths are fixed for each system, so the OFDM symbol length information could be pre-stored in the compression process size determination units. For example, in an LTE wireless system, if the starting position of an OFDM symbol having a CP (cyclic prefix) length of 160 is known, then the starting positions and OFDM symbol lengths of subsequent OFDM symbols will also be known. For this reason, it is sufficient to acquire just the starting position information for an OFDM symbol having a CP length of 160. Additionally, since the OFDM signals are outputted continuously, it is sufficient to obtain the starting position of an OFDM symbol just once, and there is no need to periodically acquire starting position information.

Figure 3:
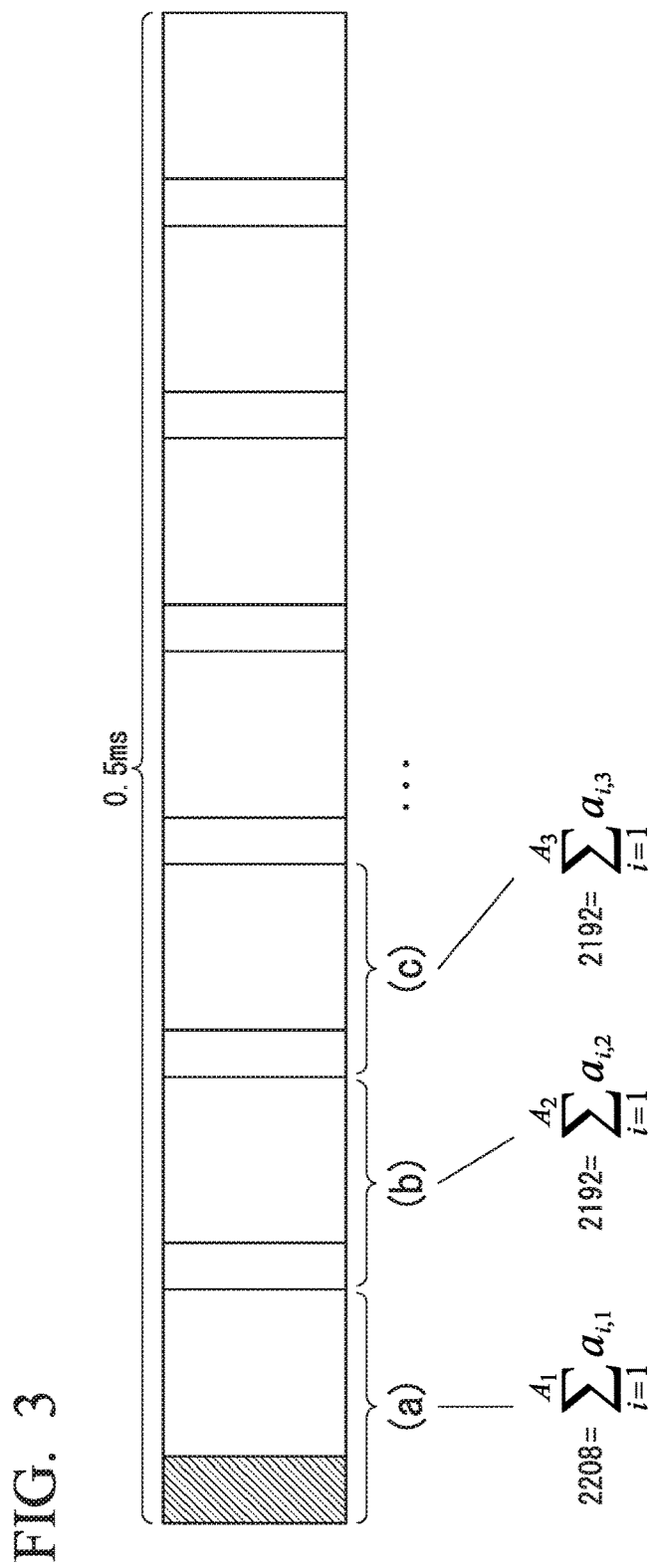
FIG. 3 is a diagram illustrating an operation example of a compression process size determination unit and an expansion process size determination unit.

FIG. 3 is a diagram illustrating an operation example of a compression process size determination unit and an expansion process size determination unit.

In the example shown in FIG. 3, multiple OFDM symbols are shown. (a) represents a first OFDM symbol, (b) represents a second OFDM symbol, and (c) represents a third OFDM symbol. By indicating the number of frames in the j-th OFDM symbol as Aj and the frame size of each frame as $a_{i,j}$ ($1 \leq i \leq Aj$), (a) to (c) can be represented respectively as shown in FIG. 3. Thus, the compression process size determination unit determines the frame sizes $a_{i,j}$ separately for each OFDM symbol, so as not to include multiple OFDM symbols. In an LTE system, the OFDM symbol lengths of the second to seventh OFDM symbols are the same, so it is possible to have the relationship, $a_{i,2}=a_{i,3}=a_{i,4}=a_{i,5}=a_{i,6}=a_{i,7}$. In this case, it is sufficient for the compression process size determination units 107 and 206 to determine two frame sizes, i.e., one for the first OFDM symbol and one for the second to seventh OFDM symbols. Additionally, the relationship may simply be $a_{1,j}=a_{2,j}=\ldots=a_{Aj,j}$. Additionally, the expansion process size determination units 113 and 203 may also determine the frame sizes (expansion sizes) in a similar manner.

Figure 4:
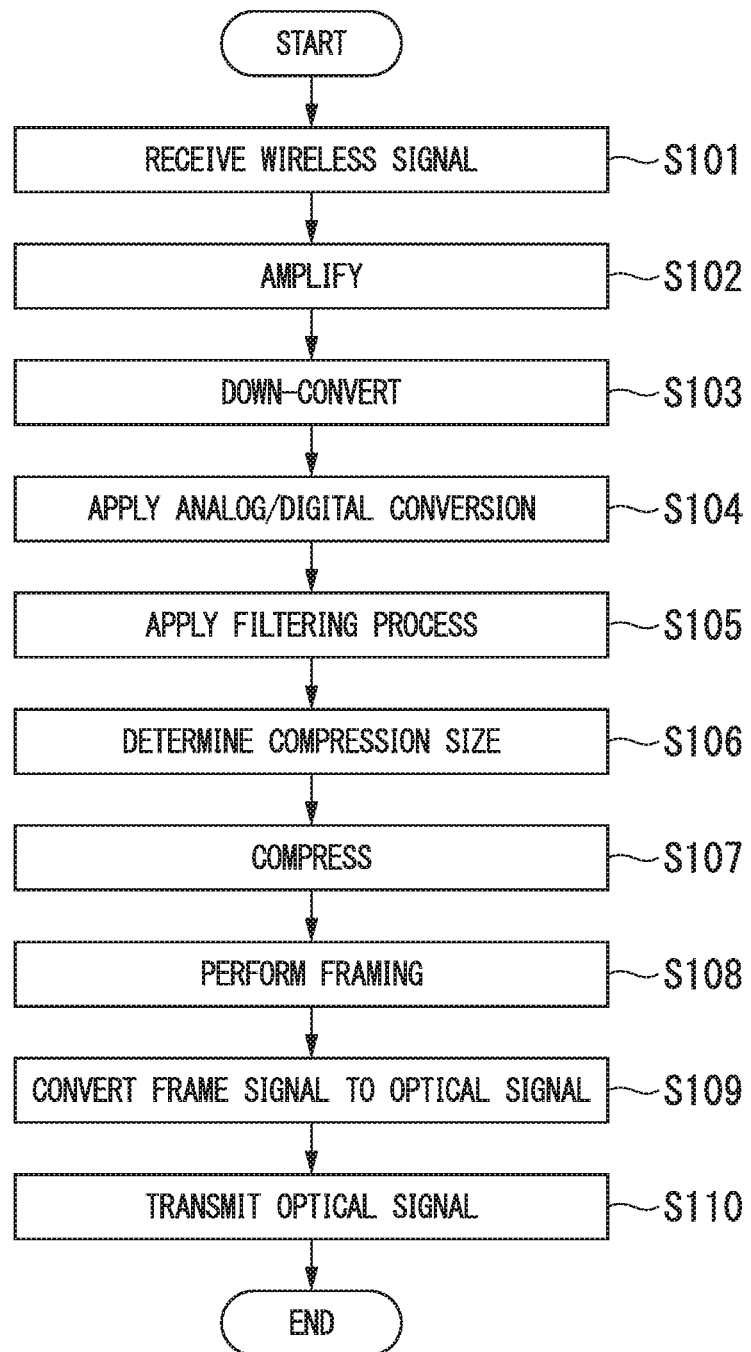
FIG. 4 is a flow chart showing the processing flow for an uplink in the RRH 100 in the first embodiment.

FIG. 4 is a flow chart showing the processing flow for an uplink in the RRH 100 in the first embodiment.

The antenna 101 receives a wireless signal (step S101). The antenna 101 outputs the received wireless signal to the amplifier 103 via a transmission/reception switching unit 102. The amplifier 103 amplifies the signal power of the wireless signal to a level allowing for signal processing (step S102). The down-conversion unit 104 down-converts the wireless signal into the baseband (step S103). Thereafter, the A/D conversion unit 105 converts the down-converted wireless signal into IQ data, which is a digital signal (step S104). The baseband filter unit 106 performs a filtering process on the IQ data (step S105).

The compression process size determination unit 107 determines the compression size based on the OFDM symbol information acquired from the BBU 200 (step S106). The compression unit 108 compresses the OFDM symbols in units of the compression sizes determined by the compression process size determination unit 107 (step S107). The framing unit 109 generates a frame signal by multiplexing the compressed OFDM symbols with a control signal (step S108). The E/O conversion unit 110 converts the frame signal into an optical signal (step S109). Then, the E/O conversion unit 110 transmits the optical signal to the BBU 200 via the optical fiber 150 (step S110).

Figure 5:
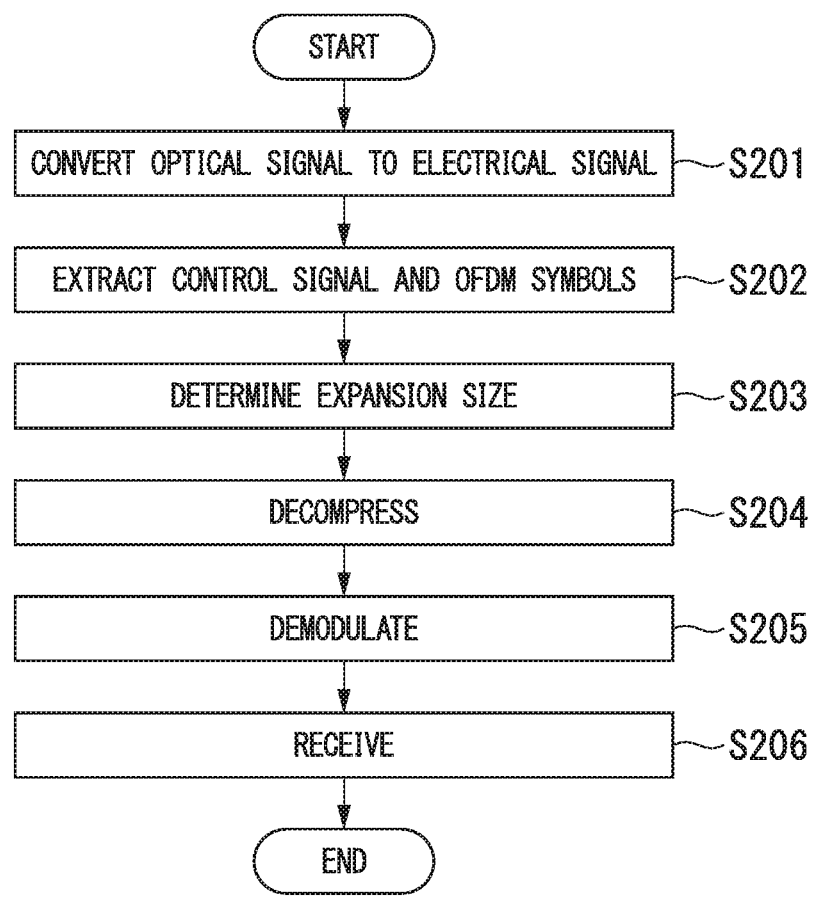
FIG. 5 is a flow chart showing the processing flow for an uplink in the BBU 200 in the first embodiment.

FIG. 5 is a flow chart showing the processing flow for an uplink in the BBU 200 in the first embodiment.

The O/E conversion unit 201 converts an optical signal received via the optical fiber 250 into a frame signal (electrical signal) (step S201). The O/E conversion unit 201 outputs the frame signal to the deframing unit 202. The deframing unit 202 extracts a control signal and compressed OFDM symbols from the frame signal (step S202). The expansion process size determination unit 203 determines the expansion sizes based on frame sizes indicated by the RRH 100 (step S203).

The expansion unit 204 restores the OFDM symbols by decompressing the OFDM symbols in units of the expansion sizes determined by the expansion process size determination unit 203 (step S204). The modulation/demodulation unit 205 restores the wireless signal by demodulating the restored OFDM symbols (step S205). The modulation/demodulation unit 205 receives the restored wireless signal (step S206). It is to be noted that the reception in the processing in step S206 refers to the modulation/demodulation unit 205 acquiring a wireless signal by demodulating OFDM symbols.

Figure 6:
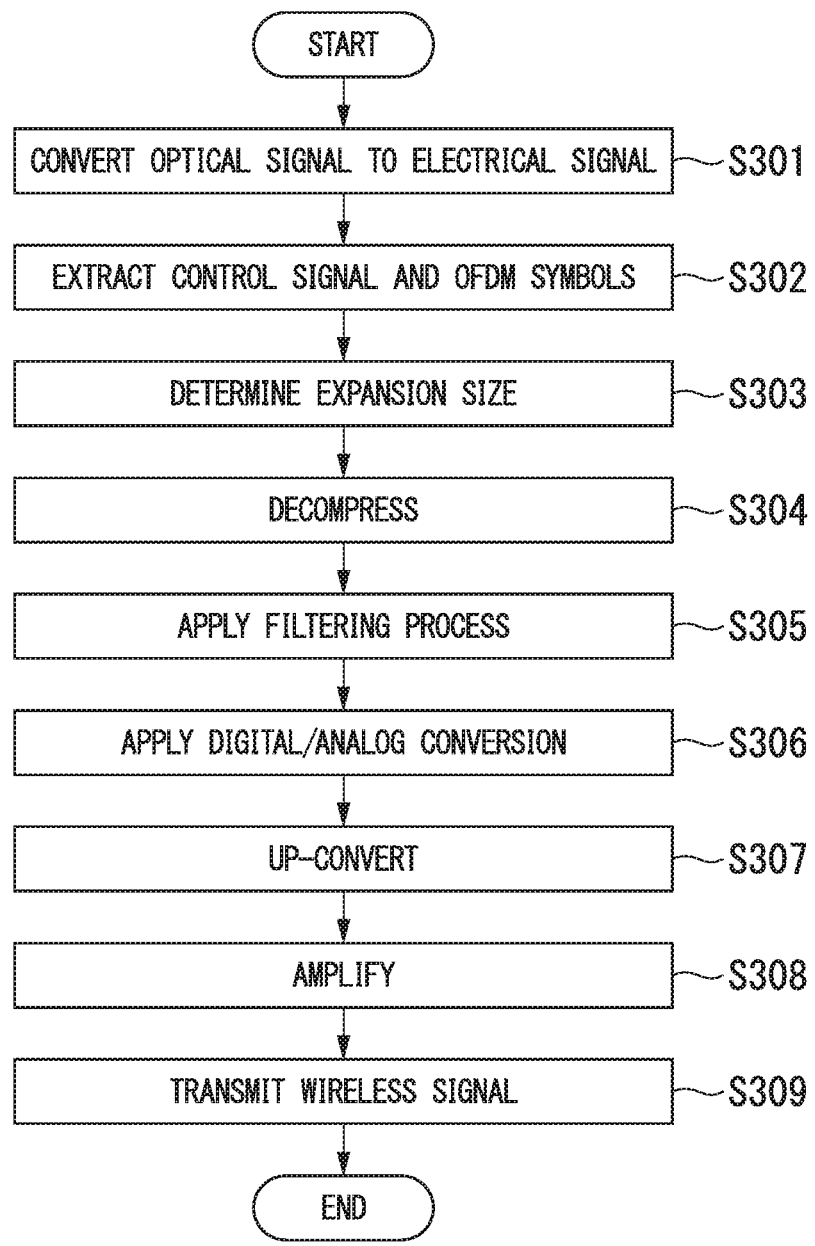
FIG. 6 is a flow chart showing the processing flow for a downlink in the RRH 100 in the first embodiment.

FIG. 6 is a flow chart showing the processing flow for a downlink in the RRH 100 in the first embodiment.

The O/E conversion unit 111 converts an optical signal received via the optical fiber 150 into a frame signal (electrical signal) (step S301). The deframing unit 112 extracts a control signal and compressed OFDM symbols from a frame signal (step S302). The expansion process size determination unit 113 determines expansion sizes based on frame sizes indicated by the BBU 200 (step S303). The expansion unit 114 restores the OFDM symbols by decompressing the compressed OFDM symbols in units of the frame sizes determined by the expansion process size determination unit 113 (step S304).

The baseband filter unit 115 performs a filtering process on the restored OFDM symbols (step S305). The D/A conversion unit 116 converts the filtered signal into an analog signal (step S306). The up-conversion unit 117 up-converts the analog signal (step S307). The amplifier 118 amplifies the power of the analog signal to a predetermined transmission power (step S308). The antenna 101 transmits the analog signal to a wireless terminal connected to the RRH 100 (step S309).

Figure 7:
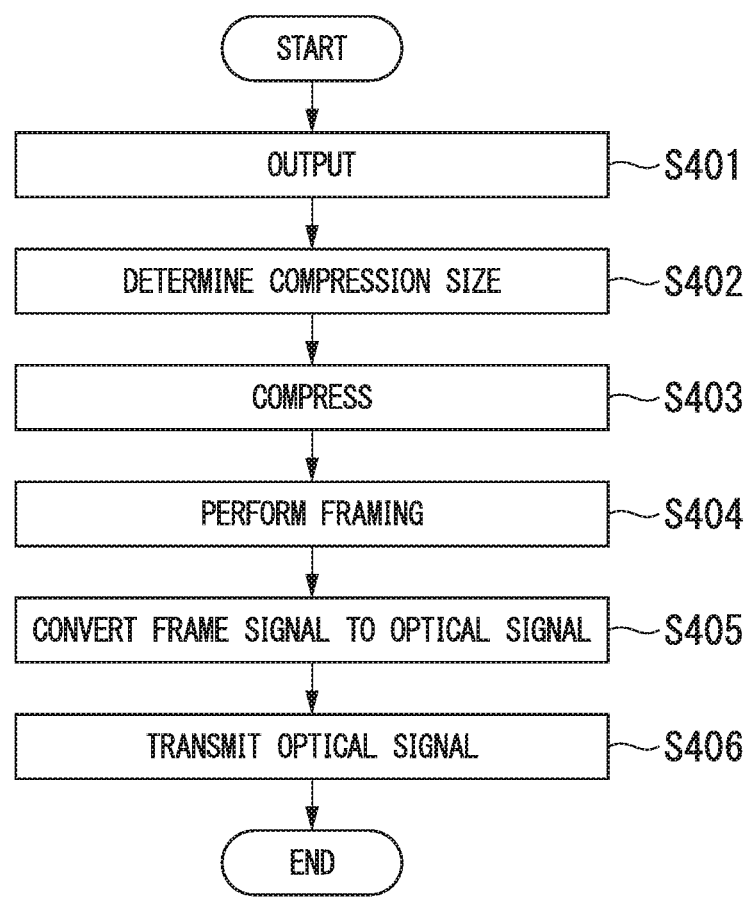
FIG. 7 is a flow chart showing the processing flow for a downlink in the BBU 200 in the first embodiment.

FIG. 7 is a flow chart showing the processing flow for a downlink in the BBU 200 in the first embodiment.

The modulation/demodulation unit 205 outputs the IQ data of a wireless signal to the compression process size determination unit 206 and the compression unit 207 (step S401). The compression process size determination unit 206 determines compression sizes based on acquired OFDM symbol information (step S402). The compression unit 207 compresses OFDM symbols in units of the compression sizes determined by the compression process size determination unit 206 (step S403). The framing unit 208 generates a frame signal by multiplexing the compressed OFDM symbols with the control signal (step S404). The E/O conversion unit 209 converts the frame signal (electrical signal) into an optical signal (step S405). The E/O conversion unit 209 transmits the optical signal to the RRH 100 via an optical fiber 250 (step S406).

According to the RRH 100 and the BBU 200 configured as above, it is possible to reduce the worsening of the compression rate. Herebelow, this effect will be explained in detail.

The RRH 100 and the BBU 200 determine the compression sizes for compressing a wireless signal based on acquired OFDM symbol information. Due to this process, the RRH 100 and the BBU 200 determine the frame sizes so as not to include OFDM symbols having different frequency characteristics when performing compression processes. Additionally, the RRH 100 and the BBU 200 perform compression in units of the determined compression sizes. For this reason, it is possible to reduce the worsening of the compression rate overall. Additionally, since the worsening of the compression rate is reduced, it is possible to make effective use of the transmission band.

[Second Embodiment]

In the second embodiment, the RRH and the BBU acquire information on the OFDM symbol starting position based on the compression rate for each OFDM symbol. Additionally, the RRH and the BBU determine the frame sizes in OFDM symbols that are to be compressed based on the acquired information on the OFDM symbol starting position and OFDM symbol length information, and perform the compression processes using the determined frame sizes.

Figure 8:
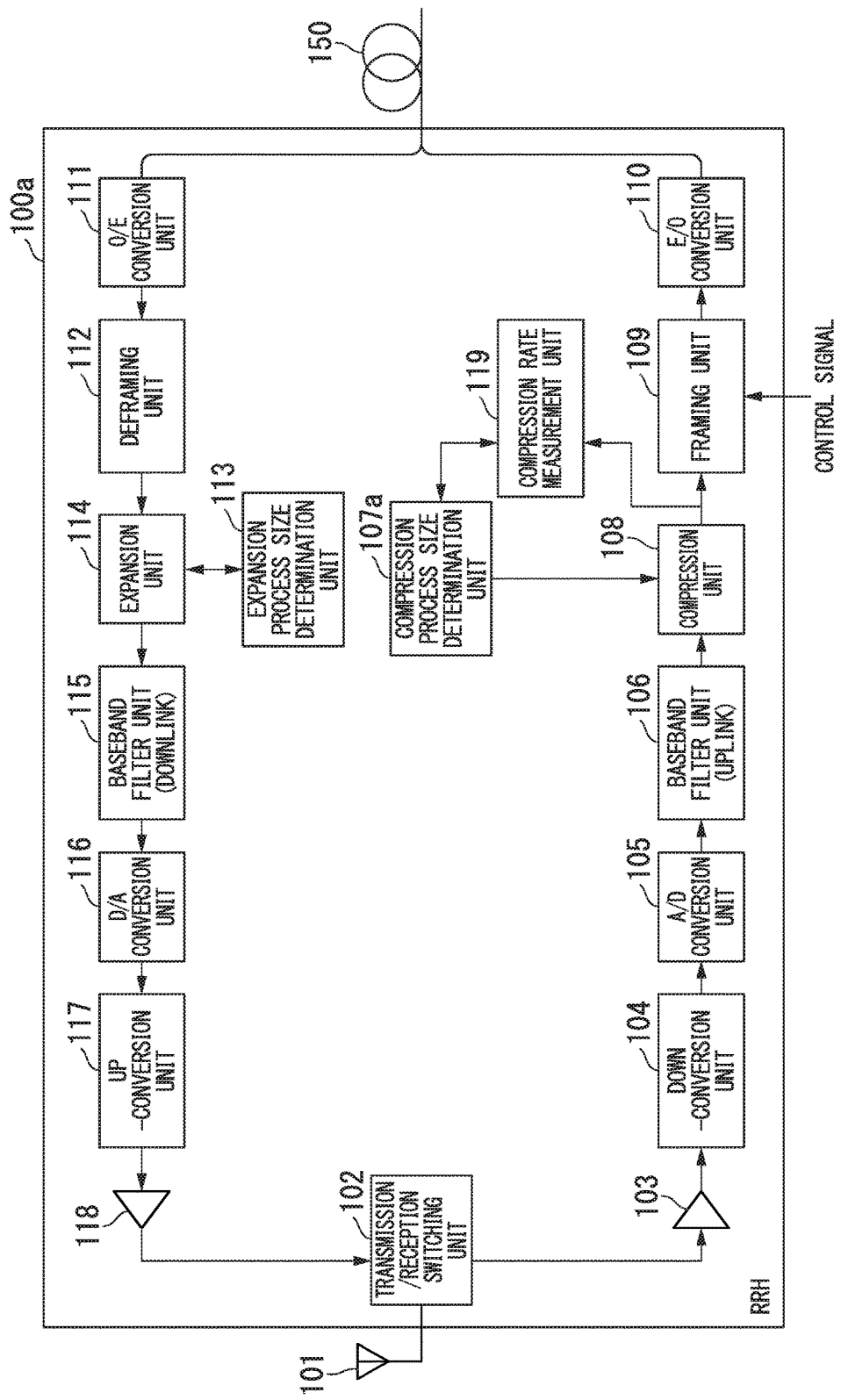
FIG. 8 is a schematic block diagram illustrating the functional structure of an RRH 100a in a second embodiment.
Figure 9:
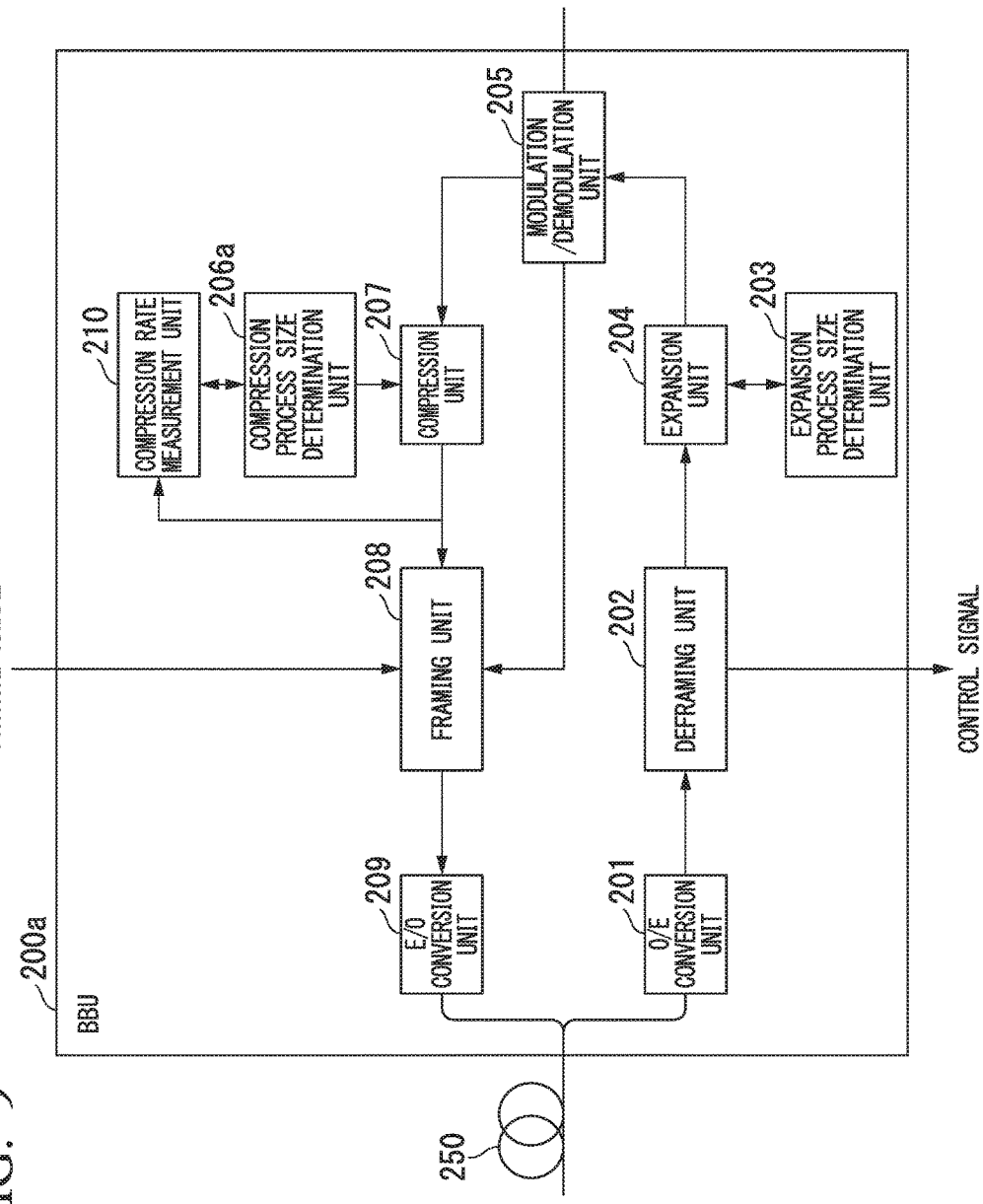
FIG. 9 is a schematic block diagram illustrating the functional structure of a BBU 200a in the second embodiment.

FIG. 8 is a schematic block diagram illustrating the functional structure of the RRH 100*a* in the second embodiment. Additionally, FIG. 9 is a schematic block diagram illustrating the functional structure of the BBU 200*a* in the second embodiment. First, the RRH 100*a* will be explained.

The RRH 100*a* includes an antenna 101, a transmission/reception switching unit 102, an amplifier 103, a down-conversion unit 104, an A/D conversion unit 105, a baseband filter unit 106, a compression process size determination unit 107*a*, a compression unit 108, a framing unit 109, an E/O conversion unit 110, an O/E conversion unit 111, a deframing unit 112, an expansion process size determination unit 113, an expansion unit 114, a baseband filter unit 115, a D/A conversion unit 116, an up-conversion unit 117, an amplifier 118, and a compression rate measurement unit 119.

The RRH 100*a* has a different structure from the RRH 100 in that a compression process size determination unit 107*a* is provided instead of the compression process size determination unit 107, and a compression rate measurement unit 119 is newly provided. The other features of the RRH 100*a* are the same as those in the RRH 100. For this reason, the explanation of the RRH 100*a* as a whole will be omitted, and only the compression process size determination unit 107*a* and the compression rate measurement unit 119 will be explained.

The compression rate measurement unit 119 measures the compression rate for each OFDM symbol using the output from the compression unit 108.

The compression process size determination unit 107*a* determines the compression sizes based on the compression rates measured by the compression rate measurement unit 119. Specifically, the compression process size determination unit 107*a* acquires, as the OFDM symbol starting position, the position at which the average value, the maximum value, or the like of the measured compression rates is smallest. Furthermore, the compression process size determination unit 107*a* determines the compression sizes so as not to cross between OFDM symbols having different frequency characteristics, based on the acquired OFDM symbol starting position information and the OFDM symbol length information. It is to be noted that in the second embodiment, the compression process size determination unit 107*a* must acquire the OFDM symbol length information by the method in the first embodiment, or have the information pre-stored.

Next, the BBU 200*a* will be explained.

The BBU 200*a* includes an O/E conversion unit 201, a deframing unit 202, an expansion process size determination unit 203, an expansion unit 204, a modulation/demodulation unit 205, a compression process size determination unit 206*a*, a compression unit 207, a framing unit 208, an E/O conversion unit 209, and a compression rate measurement unit 210. The BBU 200*a* has a different structure from the BBU 200 in that a compression process size determination unit 206*a* is provided instead of the compression process size determination unit 206, and a compression rate measurement unit 210 is newly provided. The other features of the BBU 200*a* are the same as those in the BBU 200. For this reason, the explanation of the BBU 200*a* as a whole will be omitted, and only the compression process size determination unit 206*a* and the compression rate measurement unit 210 will be explained. The processing in the compression process size determination unit 206*a* and the compression rate measurement unit 210 are the same as the processing in the compression process size determination unit 107*a* and the compression rate measurement unit 119.

Figure 10:
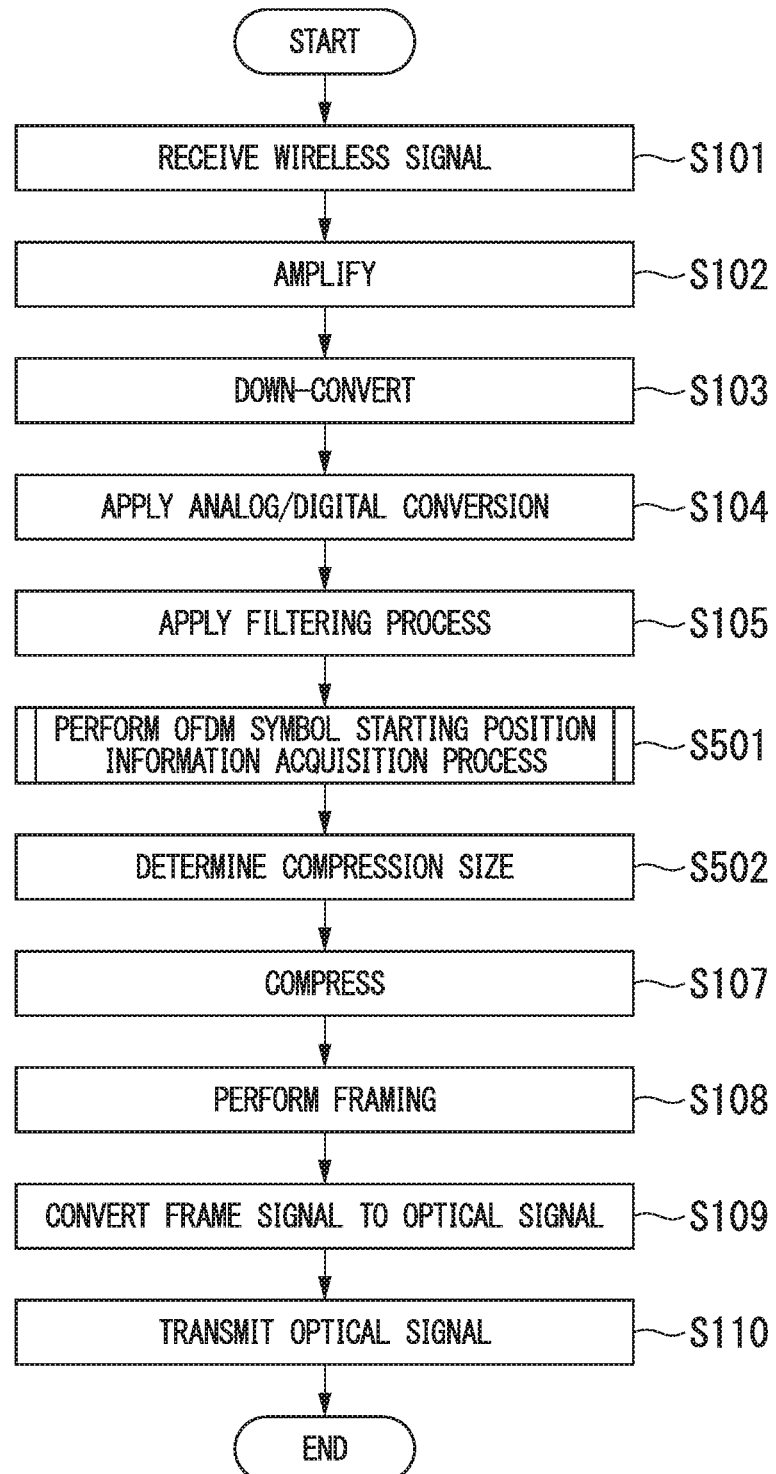
FIG. 10 is a flow chart showing the processing flow for an uplink in the RRH 100a in the second embodiment.

FIG. 10 is a flow chart of the processing flow for an uplink in the RRH 100*a* in the second embodiment. It is to be noted that in FIG. 10, the processes that are the same as those in FIG. 4 are indicated by the same reference symbols as in FIG. 4, and their explanations will be omitted.

The RRH 100*a* performs an OFDM symbol starting position information acquisition process (step S501). The OFDM symbol starting position information acquisition process will be described below. The compression process size determination unit 107*a* determines the compression sizes so as not to cross between OFDM symbols having different frequency characteristics, based on the OFDM symbol starting position information acquired in the process of step S501, and OFDM symbol length information (step S502). Thereafter, the processes of step S107 and subsequent steps are executed.

Figure 11:
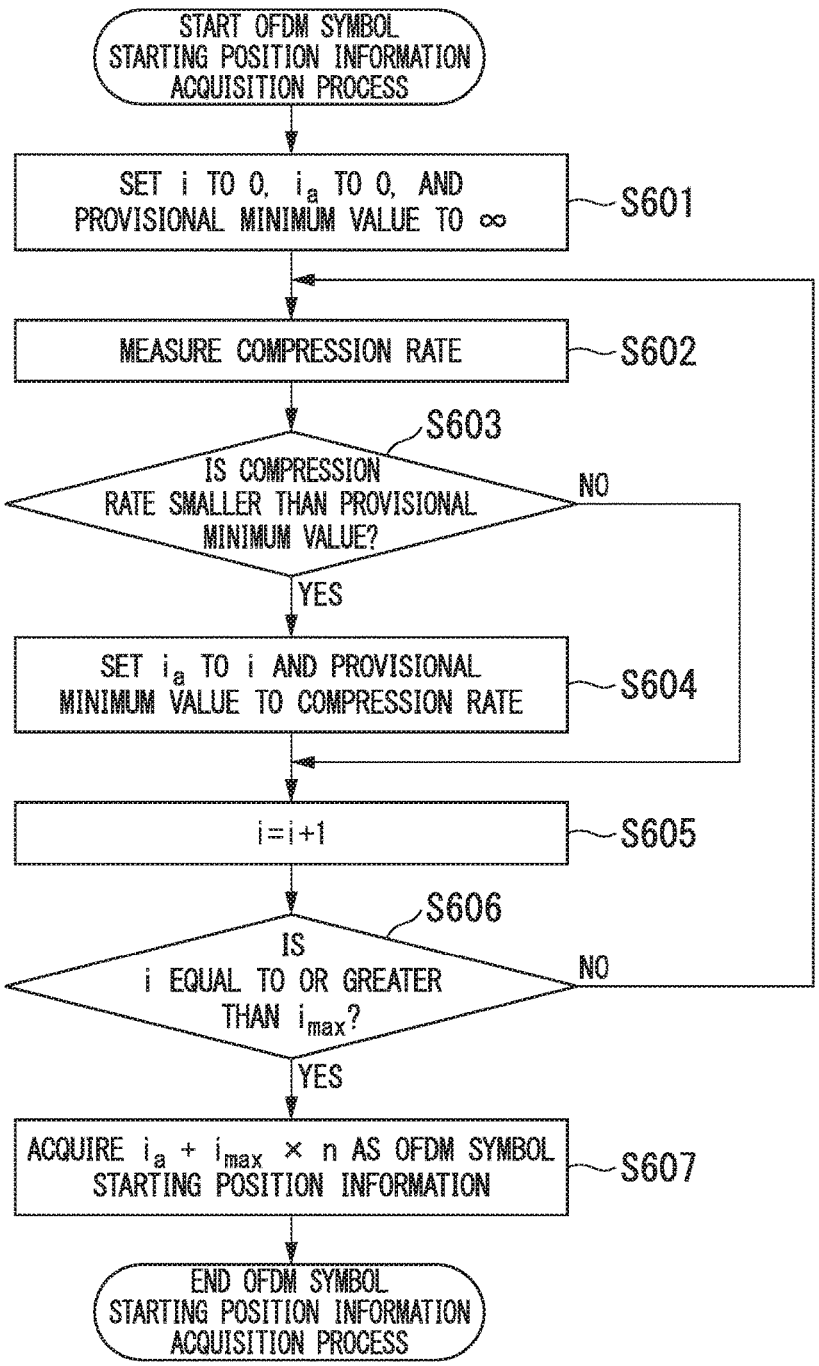
FIG. 11 is a flow chart showing the flow for an OFDM symbol starting position information acquisition process.

FIG. 11 is a flow chart showing the flow for an OFDM symbol starting position information acquisition process. In FIG. 11, an example for the case of an LTE system having a system bandwidth of 20 MHz will be explained. In LTE having a system bandwidth of 20 MHz, OFDM symbols are transmitted at a period of 0.5 ms (15360 samples). For this reason, it is sufficient for the compression process size determination unit 107*a* to be able to acquire information regarding the lead position of the 15360 samples.

First, the compression process size determination unit 107*a* sets initial values so that i=0, $i_a$=0, and a provisional minimum value is ∞ (step S601). In this case, i represents the frame number, $i_a$ represents the estimated value of the OFDM symbol starting position, and the provisional minimum value represents the minimum value of the compression rate. The compression rate measurement unit 119 measures the compression rate (step S602). The compression process size determination unit 107*a* determines whether or not the measured compression rate is smaller than the provisional minimum value (step S603). If the measured compression rate is smaller than the provisional minimum value (step S603—YES), then the compression process size determination unit 107*a* sets $i_a$ to the value of i, and sets the provisional minimum value to the measured compression rate (step S604). Thereafter, the compression process size determination unit 107*a* increments the value of i by 1 (step S605). The compression process size determination unit 107*a* determines whether or not the value of i is equal to or greater than a preset $i_{max}$ (step S606). In this case, in the case of LTE having a system bandwidth of 20 MHz, $i_{max}$ is 15360.

If the value of i is equal to or greater than the preset $i_{max}$ (step S606—YES), the compression process size determination unit 107*a* acquires, as the OFDM symbol starting information, the estimated value $i_a$ for the OFDM symbol starting position, among all of the estimated values $i_a$ for the OFDM symbol starting position, for which the compression rate characteristics are the most favorable (step S607). In this case, the OFDM symbol starting position for which the compression rate characteristics are the most favorable is the position at which the average value, the maximum value, or the like of the compression rate is the smallest.

Additionally, in step S606, if the value of i is not equal to or greater than the preset $i_{max}$ (step S606—NO), then the RRH 100*a* repeatedly runs the process of step S602 and subsequent steps.

Additionally, in step S603, if the measured compression rate is not smaller than the provisional minimum value (step S603—NO), then the compression process size determination unit 107*a* increments the value of i by 1 (step S605).

According to the RRH 100*a* and the BBU 200*a* configured as above, it is possible to obtain effects similar to those of the first embodiment.

Additionally, the RRH 100*a* and the BBU 200*a* acquire OFDM symbol starting position information based on the compression rates for compression processes performed by the compression unit 108 and the compression unit 207. Furthermore, the RRH 100*a* and the BBU 200*a* determine the compression sizes based on the acquired OFDM symbol starting position information and the OFDM symbol length information. For this reason, more highly precise compression is possible. Additionally, it is possible to correct the OFDM symbol starting position even if it has become displaced under the influence of the wireless propagation environment, processing delays in the BBU/RRH, or delays in a fiber between the BBU 200*a* and the RRH 100*a*.

The compression rate measurement unit 119 and the compression rate measurement unit 210 may reduce the amount of computation by using the results of analyses performed by the compression unit instead of measuring the compression rate. Specifically, the compression rate measurement unit 119 and the compression rate measurement unit 210 estimate the information amount, i.e., the compression rate, in each frame, by using an auto-correlation coefficients and PARCOR (Partial Auto-Correlation) coefficients obtained during linear predictive analysis. Due to this process, it is possible to reduce the processing amount needed for entropy coding.

[Third Embodiment]

In the third embodiment, the RRH and the BBU acquire OFDM symbol information from the IQ data on the downlink or the uplink. Additionally, the RRH and the BBU determine the frame sizes in OFDM symbols that are to be compressed based on the acquired OFDM symbol information, and perform the compression processes using the determined frame sizes.

Figure 12:
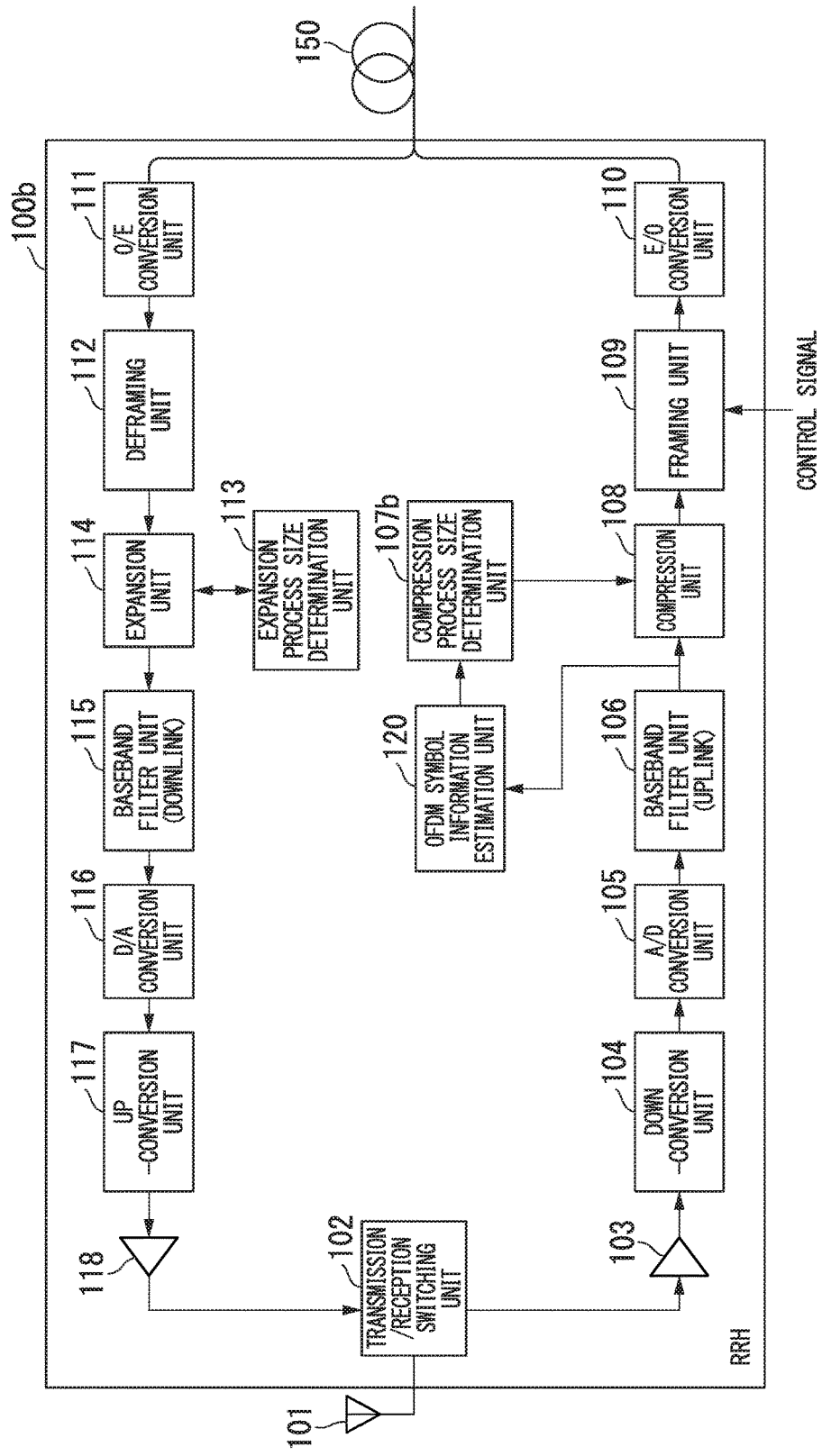
FIG. 12 is a schematic block diagram illustrating the functional structure of an RRH 100b in a third embodiment.
Figure 13:
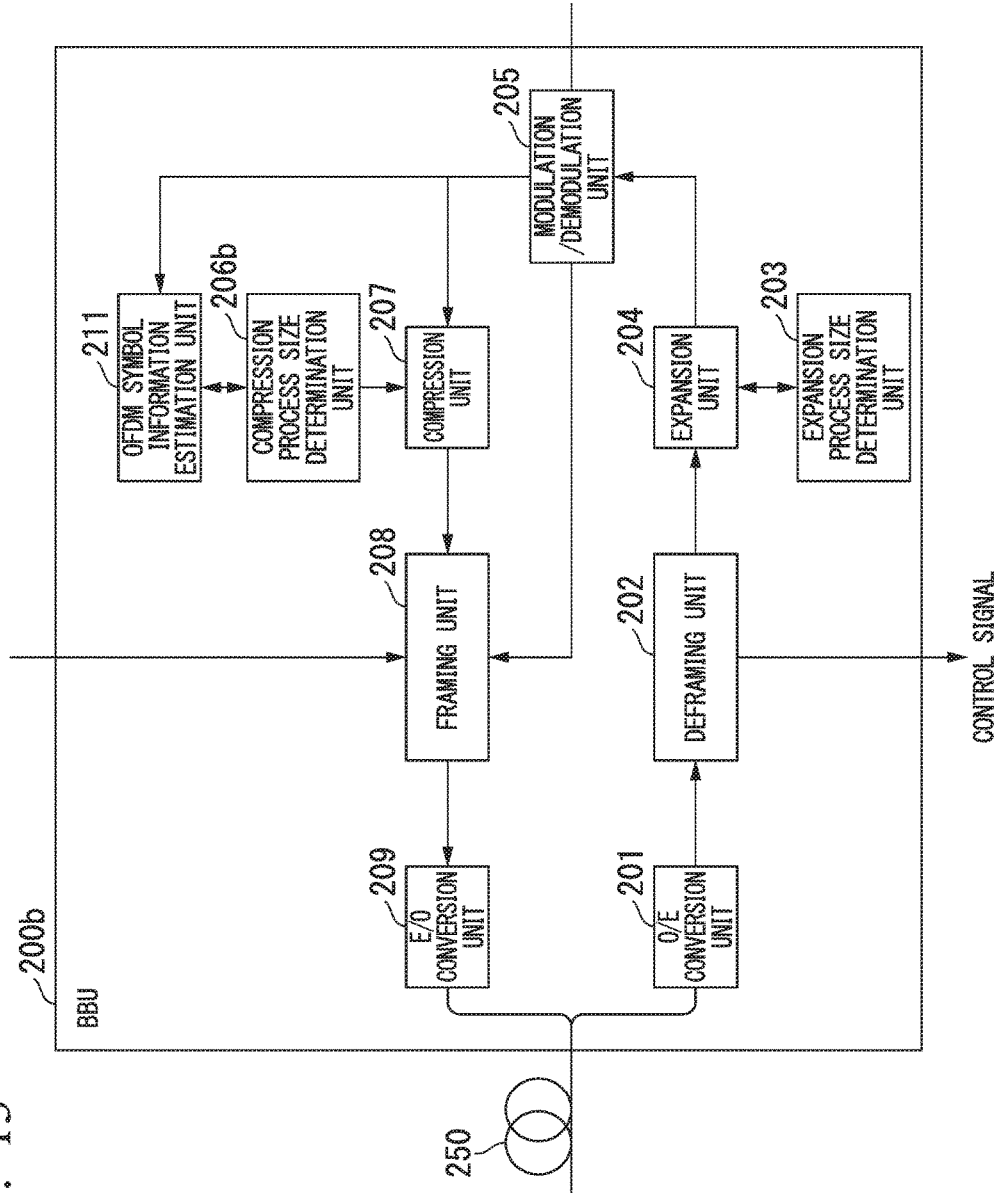
FIG. 13 is a schematic block diagram illustrating the functional structure of a BBU 200b in the third embodiment.

FIG. 12 is a schematic block diagram illustrating the functional structure of the RRH 100b in the third embodiment. Additionally, FIG. 13 is a schematic block diagram illustrating the functional structure of the BBU 200b in the third embodiment. First, the RRH 100b will be explained.

The RRH 100b includes an antenna 101, a transmission/reception switching unit 102, an amplifier 103, a down-conversion unit 104, an A/D conversion unit 105, a baseband filter unit 106, a compression process size determination unit 107b, a compression unit 108, a framing unit 109, an E/O conversion unit 110, an O/E conversion unit 111, a deframing unit 112, an expansion process size determination unit 113, an expansion unit 114, a baseband filter unit 115, a D/A conversion unit 116, an up-conversion unit 117, an amplifier 118, and an OFDM symbol information estimation unit 120.

The RRH 100b has a different structure from the RRH 100 in that a compression process size determination unit 107b is provided instead of the compression process size determination unit 107, and an OFDM symbol information estimation unit 120 is newly provided. The other features of the RRH 100b are the same as those in the RRH 100. For this reason, the explanation of the RRH 100b as a whole will be omitted, and only the compression process size determination unit 107b and the OFDM symbol information estimation unit 120 will be explained.

The OFDM symbol information estimation unit 120 estimates the OFDM symbol starting position and the OFDM symbol length information by using the uplink signal.

The compression process size estimation unit 107b acquires OFDM symbol information estimated by the OFDM symbol information estimation unit 120. Furthermore, the compression process size determination unit 107b determines the compression size based on the acquired OFDM symbol information.

Next, the BBU 200b will be explained.

The BBU 200b includes an O/E conversion unit 201, a deframing unit 202, an expansion process size determination unit 203, an expansion unit 204, a modulation/demodulation unit 205, a compression process size determination unit 206b, a compression unit 207, a framing unit 208, an E/O conversion unit 209, and an OFDM symbol information estimation unit 211. The BBU 200b has a different structure from the BBU 200 in that a compression process size determination unit 206b is provided instead of the compression process size determination unit 206, and an OFDM symbol information estimation unit 211 is newly provided. The other features of the BBU 200b are the same as those in the BBU 200. For this reason, the explanation of the BBU 200b as a whole will be omitted, and only the compression process size determination unit 206b and the OFDM symbol information estimation unit 211 will be explained.

The OFDM symbol information estimation unit 211 estimates the OFDM symbol starting position and the OFDM symbol length information by using the downlink signal.

The compression process size determination unit 206b acquires OFDM symbol information estimated by the OFDM symbol information estimation unit 211. Furthermore, the compression process size determination unit 206b determines the compression size based on the acquired OFDM symbol information.

Figure 14:
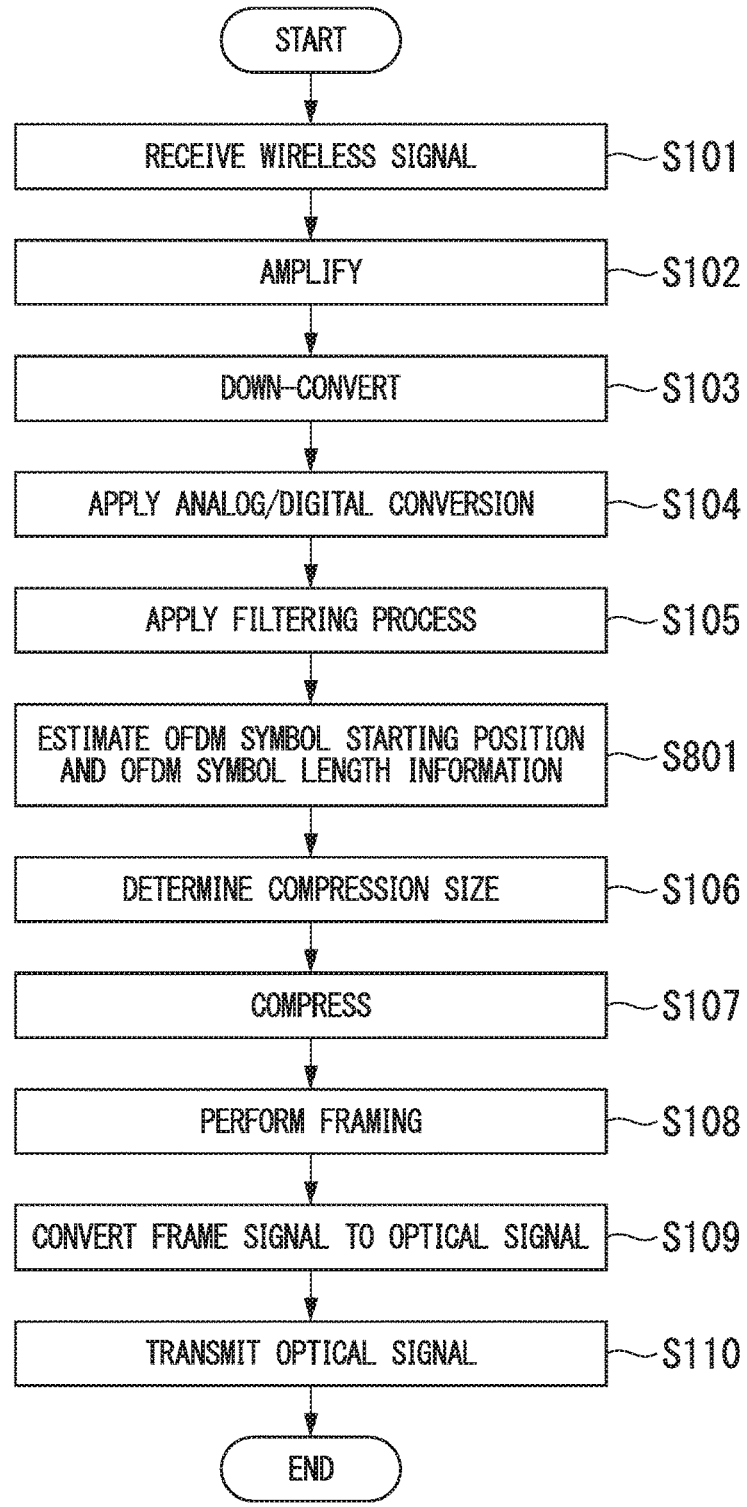
FIG. 14 is a flow chart showing the processing flow for an uplink in the RRH 100b in the third embodiment.
Figure 15:
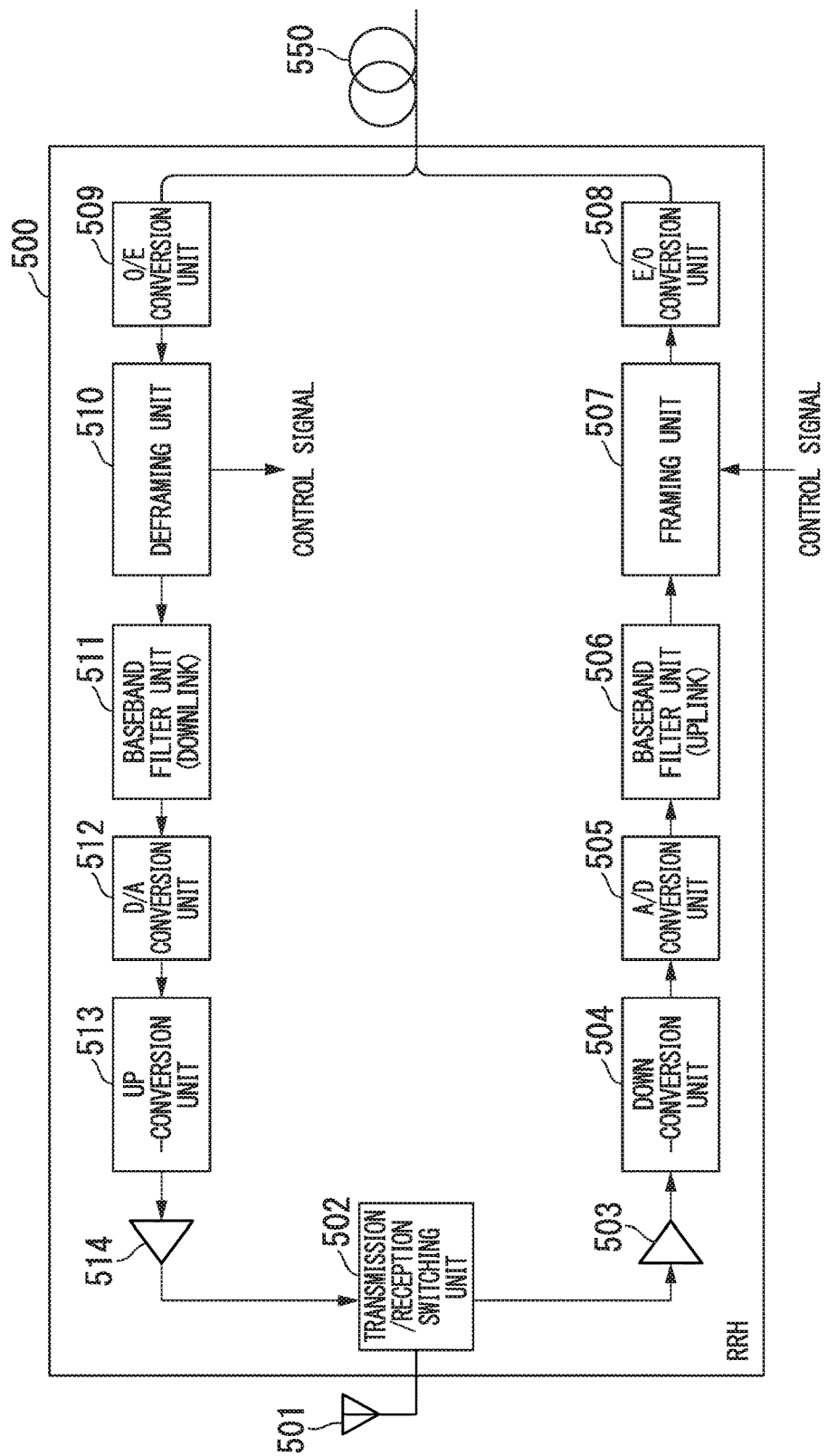
FIG. 15 is a schematic block diagram illustrating the functional structure of an RRH 500 during digital RoF transmission.
Figure 16:
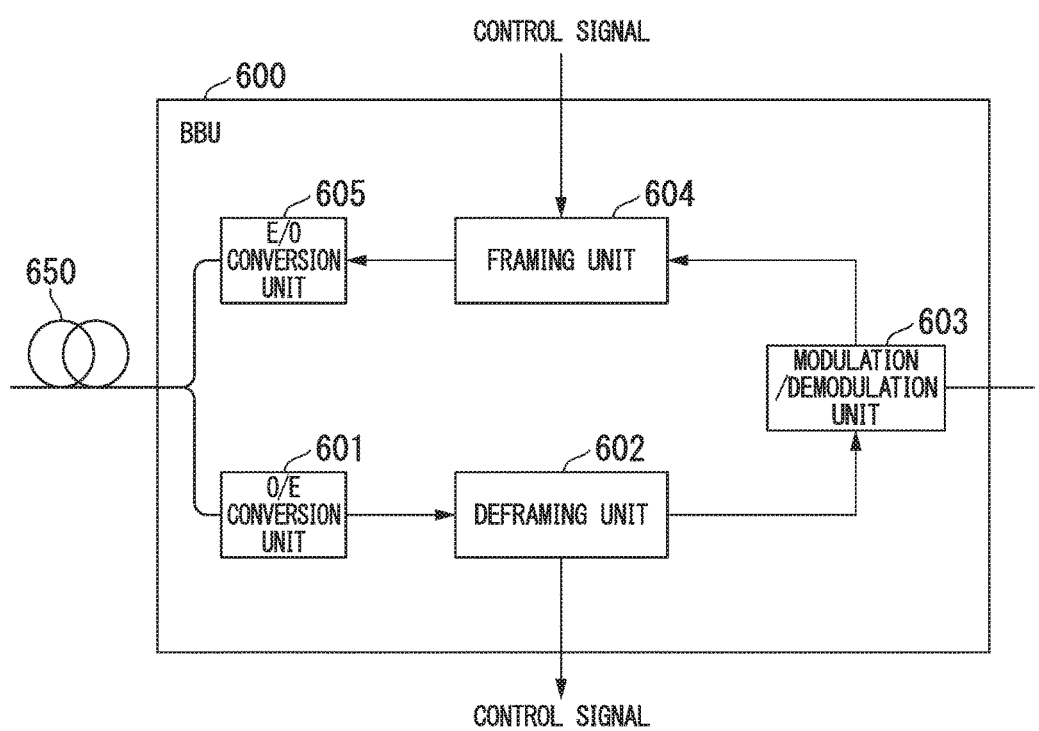
FIG. 16 is a schematic block diagram illustrating the functional structure of a BBU 600 during digital RoF transmission.
Figure 17:
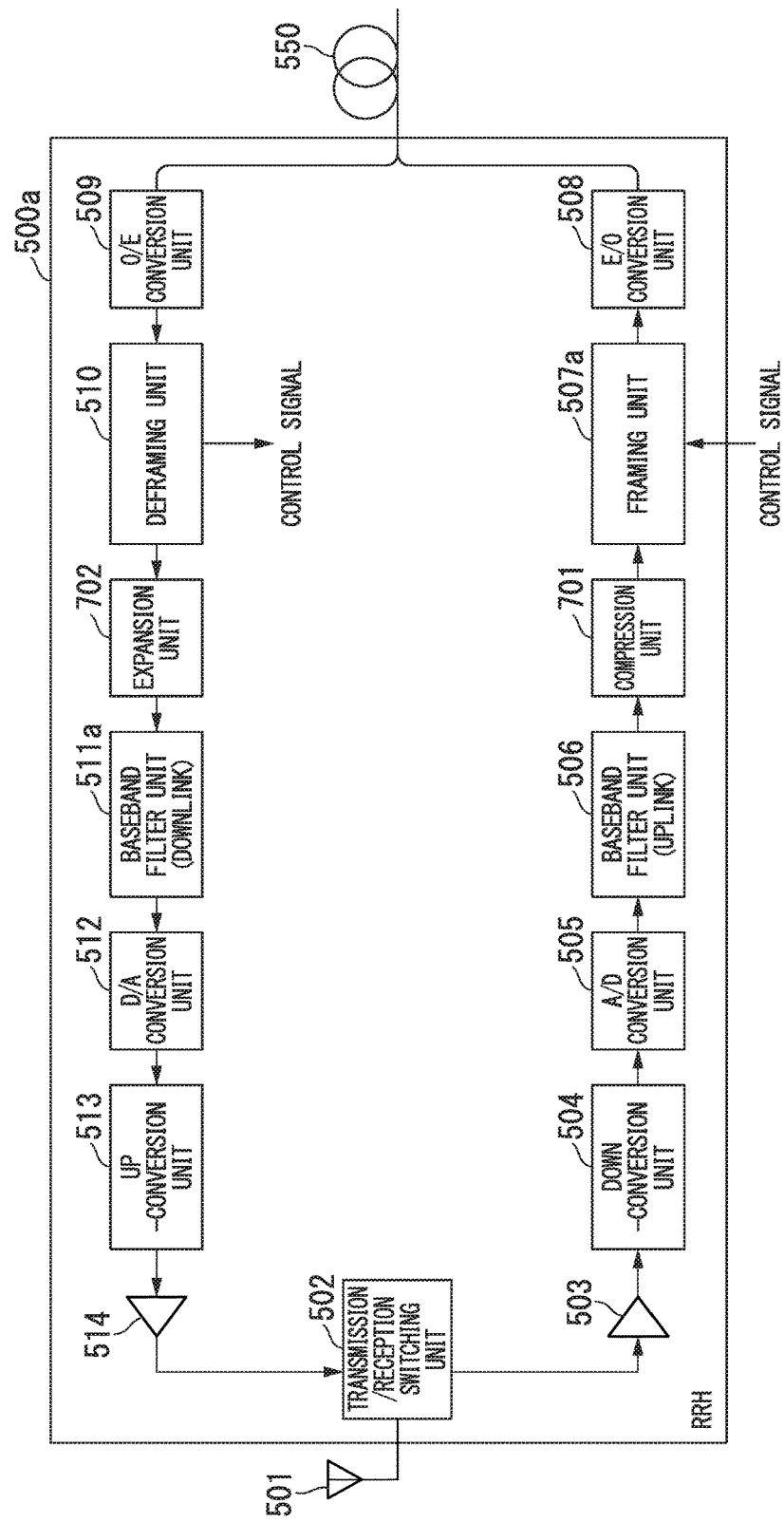
FIG. 17 is a schematic block diagram illustrating the functional structure of an RRH 500a when compression technology is incorporated during multiplexed transmission.
Figure 18:
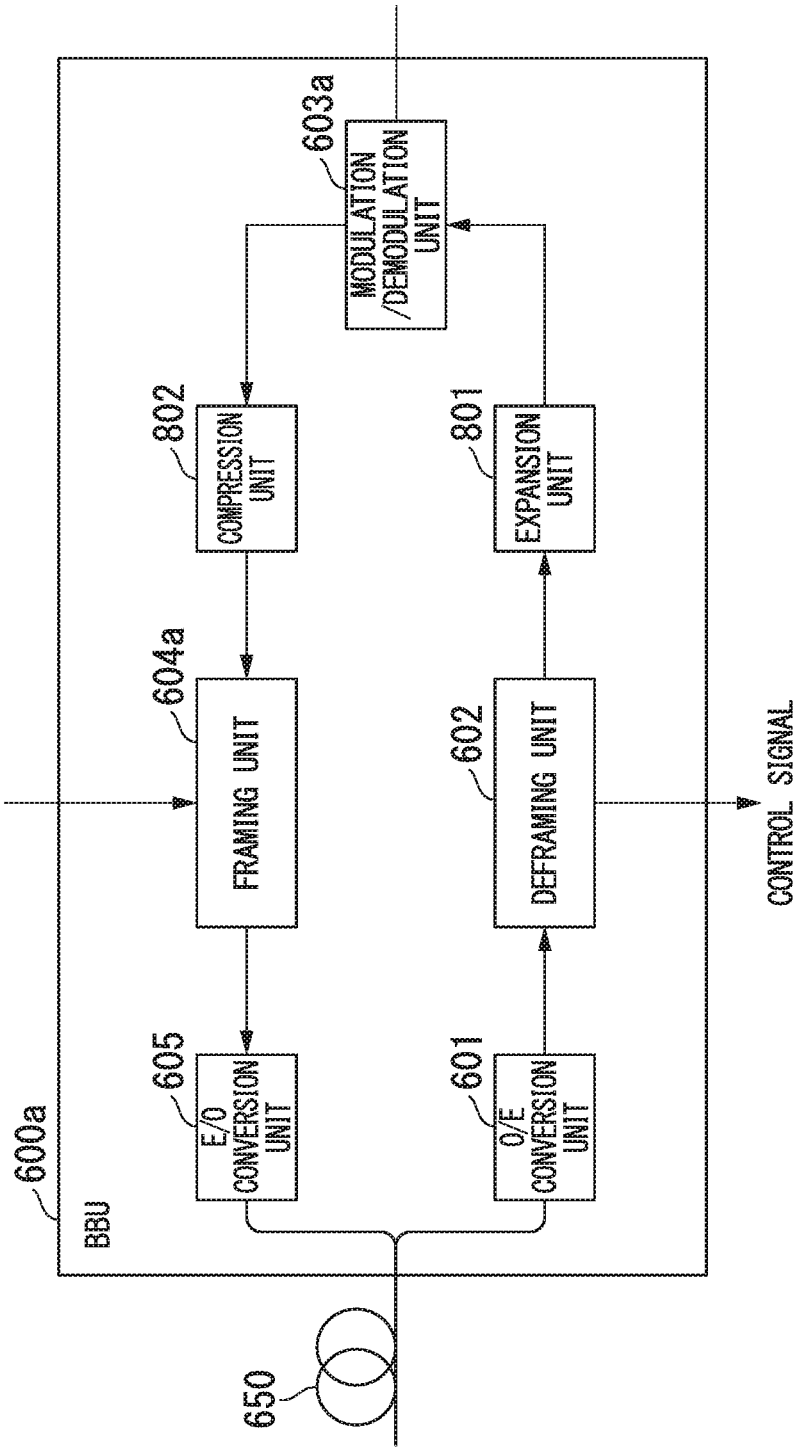
FIG. 18 is a schematic block diagram illustrating the functional structure of a BBU 600a when compression technology is incorporated during multiplexed transmission.
Figure 19:
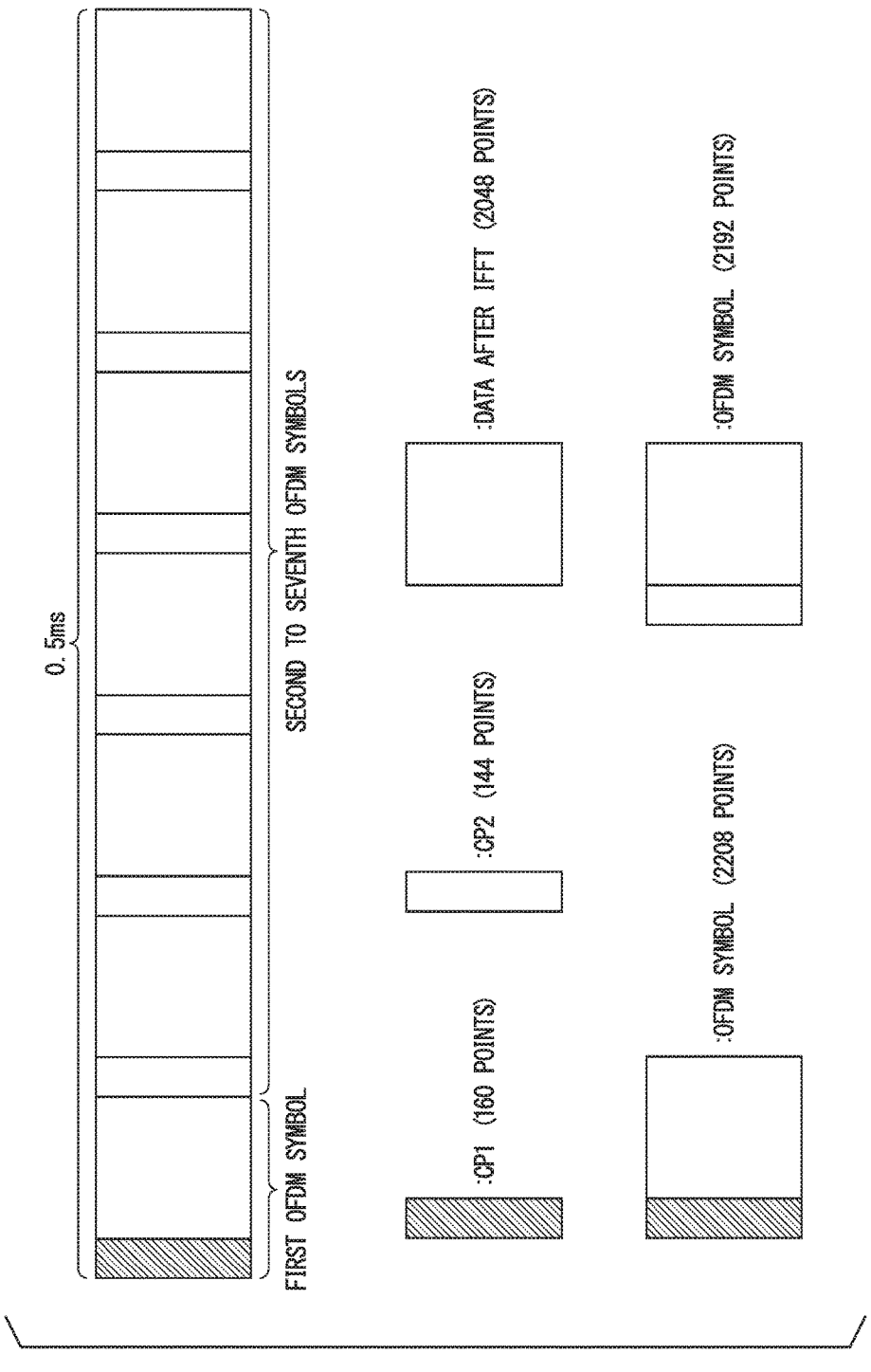
FIG. 19 is a diagram illustrating the structure of time slots in LTE.

FIG. 14 is a flow chart of the processing flow for an uplink in the RRH 100b in the third embodiment. It is to be noted that in FIG. 14, the processes that are the same as those in FIG. 4 are indicated by the same reference symbols as in FIG. 4, and their explanations will be omitted.

The OFDM symbol information estimation unit 120 estimates the OFDM symbol starting position and OFDM symbol length information by using the uplink signal (step S801). As a method for estimating the OFDM symbol starting position and the OFDM symbol length information, there is a method of applying an FFT transform to the IQ data and measuring the EVM (Error Vector Magnitude). In this case, the OFDM symbol information estimation unit 120 shifts the FFT window one point at a time, and estimates the OFDM symbol starting position or the cyclic prefix length (OFDM symbol length) information by the positions or periods at which the EVM after an FFT is smallest. Alternatively, the OFDM symbol information estimation unit 120 may estimate the OFDM symbol starting position or the cyclic prefix length (OFDM symbol length) by using an autocorrelation of the uplink signal, so as to make use of the periodicity of the cyclic prefix. It is to be noted that the OFDM symbol length information may be acquired by the method of the first embodiment, or may be pre-stored in the OFDM symbol information estimation unit 120.

According to the RRH 100b and the BBU 200b configured as above, it is possible to obtain effects similar to those of the first embodiment.

Additionally, the RRH 100b and the BBU 200b can correct the OFDM symbol starting position even if it has become displaced under the influence of the wireless propagation environment, processing delays in the BBU/RRH, or delays in a fiber between the BBU 200b and the RRH 100b. Additionally, the RRH 100b and the BBU 200b can estimate the OFDM symbol starting position and the OFDM symbol length information by using the downlink signal and the uplink signal respectively, without requiring any additional information in order to estimate the OFDM symbol starting position and the OFDM symbol length information.

It is to be noted that the various above-mentioned processes relating to the processing in the RRH 100, the RRH 100a, the RRH 100b, the BBU 200, the BBU 200a. and the BBU 200b of the present invention may be performed by recording, onto a computer-readable recording medium, programs for executing the processing in the RRH 100, the RRH 100a, the RRH 100b, the BBU 200, the BBU 200a, and the BBU 200b, and reading and running the programs recorded on said recording medium on a computer system. It is to be noted that the "computer system" as referred to herein may include an OS (Operating System) and/or hardware such as peripheral devices. Additionally, the "computer system", if using a WWW (World Wide Web) system, may include a homepage-providing environment (or display environment). Additionally, "computer-readable recording medium" refers to writable non-volatile memories such as flexible disks, magneto-optic disks, ROMs (Read Only Memories), and flash memories, portable media such as CD (Compact Disc)-ROMs or the like, or memory apparatus such as hard disks that are internally provided in computer systems.

Furthermore, the "computer-readable recording medium" includes media that hold a program for a certain period of time, such as volatile memories (e.g. DRAMs (Dynamic Random Access Memories)) inside computer systems serving as servers or clients when the program is transmitted over a network such as the internet or over communication lines such as telephone lines. Additionally, the above-mentioned program may be transmitted from a computer system that stores the program in a memory apparatus or the like, to another computer system, via a transmission medium or by transmission waves in a transmission medium. In this case, the "transmission medium" that transmits the program refers to a medium having the function of transmitting information, including networks (communication networks) such as the internet or communication lines (communication cables) such as telephone lines. Additionally, the above-mentioned program may be for implementing just some of the aforementioned functions. Furthermore, the above-mentioned program may be a so-called difference file (difference program) that can be implemented by combining the aforementioned functions with a program that is already recorded in a computer system.

While embodiments of the present invention have been described in detail by referring to the drawings above, the specific structure is not limited to these embodiments, and other designs or the like within a range not departing from the gist of the present invention are included.

INDUSTRIAL APPLICABILITY

The present invention may, for example, be applied to digital RoF transmission. According to the present invention, it is possible to reduce the worsening of the compression rate.

DESCRIPTION OF REFERENCE SIGNS 100, 100a, 100b, 500, 500a RRH
200, 200a, 200b, 600, 600a BBU
101, 501 Antenna
102, 502 Transmission/reception switching unit
103, 503 Amplifier
104, 504 Down-conversion unit
105, 505 A/D conversion unit
106, 506 Baseband filter unit (uplink)
107, 107a, 107b Compression process size determination unit
108, 701 Compression unit
109, 507, 507a Framing unit
110, 508. E/O conversion unit
111, 509 O/E conversion unit
112, 510 Deframing unit
113 Expansion process size determination unit
114, 702 Expansion unit
115, 511, 511a Baseband filer unit (downlink)
116, 512 D/A conversion unit
117, 513 Up-conversion unit
118, 514 Amplifier
119 Compression rate measurement unit
120 OFDM symbol information estimation unit
150, 250, 550, 650 Optical fiber
201, 601 O/E conversion unit
202, 602 Deframing unit
203 Expansion process size determination unit
204, 801 Expansion unit
205, 603, 603a Modulation/demodulation unit
206, 206a, 206b Compression process size determination unit
207, 802 Compression unit
208, 604, 604a Framing unit
209, 605 E/O conversion unit
210 Compression rate measurement unit
211 OFDM symbol information estimation unit

The invention claimed is:

1. An optical communication system comprising:
a signal processing apparatus and a wireless apparatus, wherein functions of a base station are divided between the signal processing apparatus and the wireless apparatus,
wherein a periodic symbol sequence in which a cyclic prefix appended to a signal of a predetermined size to which an IFFT (Inverse Fast Fourier Transform) has been applied is transmitted between the signal processing apparatus and the wireless apparatus by means of digital RoF (Radio over Fiber) transmission,
the signal processing apparatus and the wireless apparatus each comprise a transmission unit and a reception unit,
the periodic symbol sequence includes different kinds of symbols having different lengths,
each of the symbols constituting the periodic symbol sequence includes a cyclic prefix,
the transmission unit comprises:
a compression size determination unit that acquires symbol information relating to a starting position of the periodic symbol sequence and lengths of the symbols constituting the periodic symbol sequence and determines, based on the acquired symbol information, a compression size for each of symbols that are to be compressed; and
a compression unit that compresses the periodic symbol sequence in units of determined compression sizes, and
the reception unit comprises:
an expansion size determination unit that determines an expansion size for each of symbols in the periodic symbol sequence that are to be expanded; and
an expansion unit that expands the periodic symbol sequence in units of determined expansion sizes.

2. An optical communication system comprising:
a signal processing apparatus and a wireless apparatus, wherein functions of a base station are divided between the signal processing apparatus and the wireless apparatus,
wherein a periodic symbol sequence in which a cyclic prefix appended to a signal of a predetermined size to which an IFFT (Inverse Fast Fourier Transform) has been applied is transmitted between the signal processing apparatus and the wireless apparatus by means of digital RoF (Radio over Fiber) transmission,
the signal processing apparatus and the wireless apparatus each comprise a transmission unit and a reception unit;
the transmission unit comprises:
a compression size determination unit that acquires symbol information relating to a starting position of the periodic symbol sequence and lengths of symbols constituting the periodic symbol sequence and determines, based on the acquired symbol information, a compression size for each of symbols that are to be compressed; and a compression unit that compresses the periodic symbol sequence in units of determined compression sizes, and the reception unit comprises:

an expansion size determination unit that determines an expansion size for each of symbols in the periodic symbol sequence that are to be expanded; and an expansion unit that expands the periodic symbol sequence in units of determined expansion sizes, wherein the transmission unit further comprises a compression rate measurement unit that measures a compression rate of each of the symbols, and the compression size determination unit acquires, as the starting position, a position of a symbol at which a predetermined statistical value of measured compression rates is smallest, and determines the compression sizes using the acquired starting position and information relating to the lengths of the symbols.

3. The optical communication system according to claim 1, wherein the transmission unit further comprises a symbol information estimation unit that estimates the starting position based on IQ data for a downlink or for an uplink.

4. An optical communication method in an optical communication system comprising a signal processing apparatus and a wireless apparatus, functions of a base station being divided between the signal processing apparatus and the wireless apparatus, the signal processing apparatus and the wireless apparatus each comprising a transmission unit and a reception unit, a periodic symbol sequence in which a cyclic prefix is appended to a signal of a predetermined size to which an IFFT (Inverse Fast Fourier Transform) has been applied being transmitted between the signal processing apparatus and the wireless apparatus by means of digital RoF (Radio over Fiber) transmission; the optical communication method comprising:

a compression size determination step, performed by the transmission unit, of acquiring symbol information relating to a starting position of the periodic symbol sequence that includes different kinds of symbols having different lengths, each of the symbols constituting the periodic symbol sequence including a cyclic prefix, and lengths of symbols constituting the periodic symbol sequence, and determining, based on the acquired symbol information, a compression size for each of symbols that are to be compressed;

a compression step, performed by the transmission unit, of compressing the periodic symbol sequence in units of determined compression sizes;

an expansion size determination step, performed by the reception unit, of determining an expansion size for each of symbols in the periodic symbol sequence that are to be expanded; and an expansion step, performed by the reception unit, of expanding the periodic symbol sequence in units of determined expansion sizes.

* * * * *